(12) United States Patent
Chung et al.

(10) Patent No.: US 11,520,190 B2
(45) Date of Patent: Dec. 6, 2022

(54) ELECTRONIC DEVICE

(71) Applicant: Au Optronics Corporation, Hsinchu (TW)

(72) Inventors: Yueh-Hung Chung, Hsinchu (TW); Min-Tse Lee, Hsinchu (TW); Sheng-Yen Cheng, Hsinchu (TW); Ping-Wen Chen, Hsinchu (TW); Jia-Hong Wang, Hsinchu (TW); Ti-Kuei Yu, Hsinchu (TW); Ya-Ling Hsu, Hsinchu (TW); Chen-Hsien Liao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 17/575,620

(22) Filed: Jan. 13, 2022

(65) Prior Publication Data

US 2022/0137466 A1    May 5, 2022

Related U.S. Application Data

(63) Continuation of application No. 16/993,290, filed on Aug. 14, 2020, now abandoned.

(Continued)

(30) Foreign Application Priority Data

Aug. 3, 2020   (CN) .......................... 202010775201.4

(51) Int. Cl.
G02F 1/1343       (2006.01)
G02F 1/1362       (2006.01)

(Continued)

(52) U.S. Cl.
CPC .. G02F 1/134309 (2013.01); G02F 1/133707 (2013.01); G02F 1/136213 (2013.01);
(Continued)

(58) Field of Classification Search
CPC ......... G02F 1/134309; G02F 1/136286; G02F 1/136213; G02F 1/133707;
(Continued)

(56) References Cited

U.S. PATENT DOCUMENTS

| 6,624,866 B2 | 9/2003 | Matsumoto |
| 2001/0043304 A1 | 11/2001 | Matsumoto |
| 2002/0097365 A1 | 7/2002 | Yang et al. |

FOREIGN PATENT DOCUMENTS

KR     20010105274     11/2001

*Primary Examiner* — James A Dudek
(74) *Attorney, Agent, or Firm* — JCIPRNET

(57) ABSTRACT

An electronic device including a substrate, transversal signal lines, a first vertical signal line, a second vertical signal line, and a first shielding vertical line is provided. The transversal signal lines, the first vertical signal line, the second vertical signal line, and the first shielding vertical line are disposed on the substrate. The first vertical signal line and the second vertical signal line are intersected with the transversal signal lines. The second vertical signal line is connected to one of the transversal signal lines. An orthogonal projection of the first shielding vertical line on the substrate is between an orthogonal projection of the first vertical signal line on the substrate and an orthogonal projection of the second vertical signal line on the substrate.

20 Claims, 31 Drawing Sheets

Related U.S. Application Data

(60) Provisional application No. 62/889,181, filed on Aug. 20, 2019.

(51) Int. Cl.
*G02F 1/1337* (2006.01)
*H01L 23/60* (2006.01)

(52) U.S. Cl.
CPC ........ *G02F 1/136286* (2013.01); *H01L 23/60* (2013.01); *G02F 1/134345* (2021.01); *G02F 1/136218* (2021.01)

(58) Field of Classification Search
CPC ........ G02F 2001/136218; G02F 2001/134345; H01L 23/60
See application file for complete search history.

ELECTRONIC DEVICE

CROSS-REFERENCE TO RELATED APPLICATION

This application is a continuation application of and claims the priority benefit of a prior application Ser. No. 16/993,290, filed on Aug. 14, 2020, now pending. The prior application Ser. No. 16/993,290 claims the priority benefits of U.S. provisional application Ser. No. 62/889,181, filed on Aug. 20, 2019 and China application serial no. 202010775201.4, filed on Aug. 3, 2020. The entirety of each of the above-mentioned patent applications is hereby incorporated by reference herein and made a part of this specification.

BACKGROUND

Technical Field

The disclosure relates to an electronic device.

Description of Related Art

Along with popularization of electronic products, circuit layouts in various electronic devices also become complicated. Therefore, many adjacent lines may be used to transmit different types of signals. However, a coupling effect between the adjacent lines often affects the quality of signal transmission, which leads to unsatisfactory functions finally presented. Therefore, design of circuit layout is often one of design priorities in electronic products.

SUMMARY

The disclosure is directed to an electronic device designed to facilitate reduction of a coupling effect between lines and quality improvement of the electronic device.

The disclosure provides an electronic device including a substrate, a plurality of transversal signal lines, a first vertical signal line, a second vertical signal line, and a first shielding vertical line. The transversal signal lines, the first vertical signal line, the second vertical signal line, and the first shielding vertical line are disposed on the substrate. The first vertical signal line is intersected with the transversal signal lines. The second vertical signal line is intersected with the transversal signal lines, and the second vertical signal line is connected to one of the transversal signal lines. An orthogonal projection of the first shielding vertical line on the substrate is located between an orthogonal projection of the first vertical signal line on the substrate and an orthogonal projection of the second vertical signal line on the substrate.

In an embodiment of the disclosure, the electronic device further includes a plurality of pixel structures disposed on the substrate. One of the pixel structures is surrounded by adjacent two of the transversal signal lines and the second vertical signal line and includes a pixel electrode. The pixel electrode is overlapped with the first vertical signal line or the second vertical signal line in a direction perpendicular to the substrate.

In an embodiment of the disclosure, the pixel electrode is overlapped with the first shielding vertical line.

In an embodiment of the disclosure, the pixel electrode traverses the second vertical signal line, the pixel electrode has a central trunk portion, and the second vertical signal line is overlapped with the central trunk portion.

In an embodiment of the disclosure, the first shielding vertical line is a transparent wire.

In an embodiment of the disclosure, the electronic device further includes a common electrode line. The common electrode line is disposed on the substrate. The common electrode line is located between the adjacent two of the transversal signal lines.

In an embodiment of the disclosure, the common electrode line is intersected with the first vertical signal line and the second vertical signal line.

In an embodiment of the disclosure, the first shielding vertical line and the common electrode line are directly stacked on each other.

In an embodiment of the disclosure, the electronic device further includes at least one insulating layer and a conducting structure penetrating the insulating layer. The insulating layer is disposed between the first shielding vertical line and the common electrode line, and the conducting structure electrically connects the first shielding vertical line and the common electrode line.

In an embodiment of the disclosure, the electronic device further includes a plurality of pixel structures disposed on the substrate. One of the pixel structures is located between adjacent two of the transversal signal lines and includes a pixel electrode. A film layer of the first shielding vertical line is located between a film layer of the common electrode line and a film layer of the pixel electrode.

In an embodiment of the disclosure, the electronic device further includes a plurality of pixel structures disposed on the substrate. One of the pixel structures is located between adjacent two of the transversal signal lines and includes a pixel electrode. A film layer of the common electrode line is located between a film layer of the first shielding vertical line and a film layer of the pixel electrode.

In an embodiment of the disclosure, the common electrode line includes a first line and a second line. The first shielding vertical line is overlapped with the first line, the second line, or both the first line and the second line.

In an embodiment of the disclosure, the electronic device further includes a second shielding vertical line. The first vertical signal line is located between the first shielding vertical line and the second shielding vertical line.

In an embodiment of the disclosure, the electronic device further includes a third shielding vertical line. The third shielding vertical line is located between the first vertical signal line and the second shielding vertical line.

In an embodiment of the disclosure, the electronic device further includes a fourth vertical signal line. Orthogonal projections of the first vertical signal line and the third vertical signal line on the substrate are located between the orthogonal projection of the second vertical signal line on the substrate and an orthogonal projection of the fourth vertical signal line on the substrate.

In an embodiment of the disclosure, the electronic device further includes a shielding electrode. The shielding electrode is connected to the first shielding vertical line.

In an embodiment of the disclosure, the first shielding vertical line is completely located between adjacent two of the transversal signal lines.

In an embodiment of the disclosure, the electronic device further includes a plurality of pixel structures disposed on the substrate. One of the pixel structures includes a pixel electrode. The orthogonal projection of the first shielding vertical line on the substrate is outside an orthogonal projection of the pixel electrode on the substrate.

In an embodiment of the disclosure, the electronic device further includes a plurality of pixel structures and a third vertical signal line. The pixel structures are arranged on the substrate in an array. The second vertical signal line is located between the third vertical signal line and the first vertical signal line, and the first vertical signal line, the second vertical signal line, and the third vertical signal line are located between two adjacent rows of the pixel structures.

In an embodiment of the disclosure, the electronic device further includes a second shielding vertical line disposed on the substrate. An orthogonal projection of the second shielding vertical line on the substrate is located between the orthogonal projection of the second vertical signal line on the substrate and an orthogonal projection of the third vertical signal line on the substrate.

Based on the above description, in the electronic device of the disclosure, the shielding wires are arranged between adjacent lines that transmit different signals to reduce adverse effects caused by a coupling effect between the lines. Moreover, in some embodiments, the shielding wires may be transparent wires. Therefore, when the electronic device is used for displaying images, a display aperture ratio thereof is not affected by the shielding wires and is not reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

Each of FIG. 5 to FIG. 10 is a partial schematic view of an electronic device according an embodiment of the disclosure.

Figure 2:
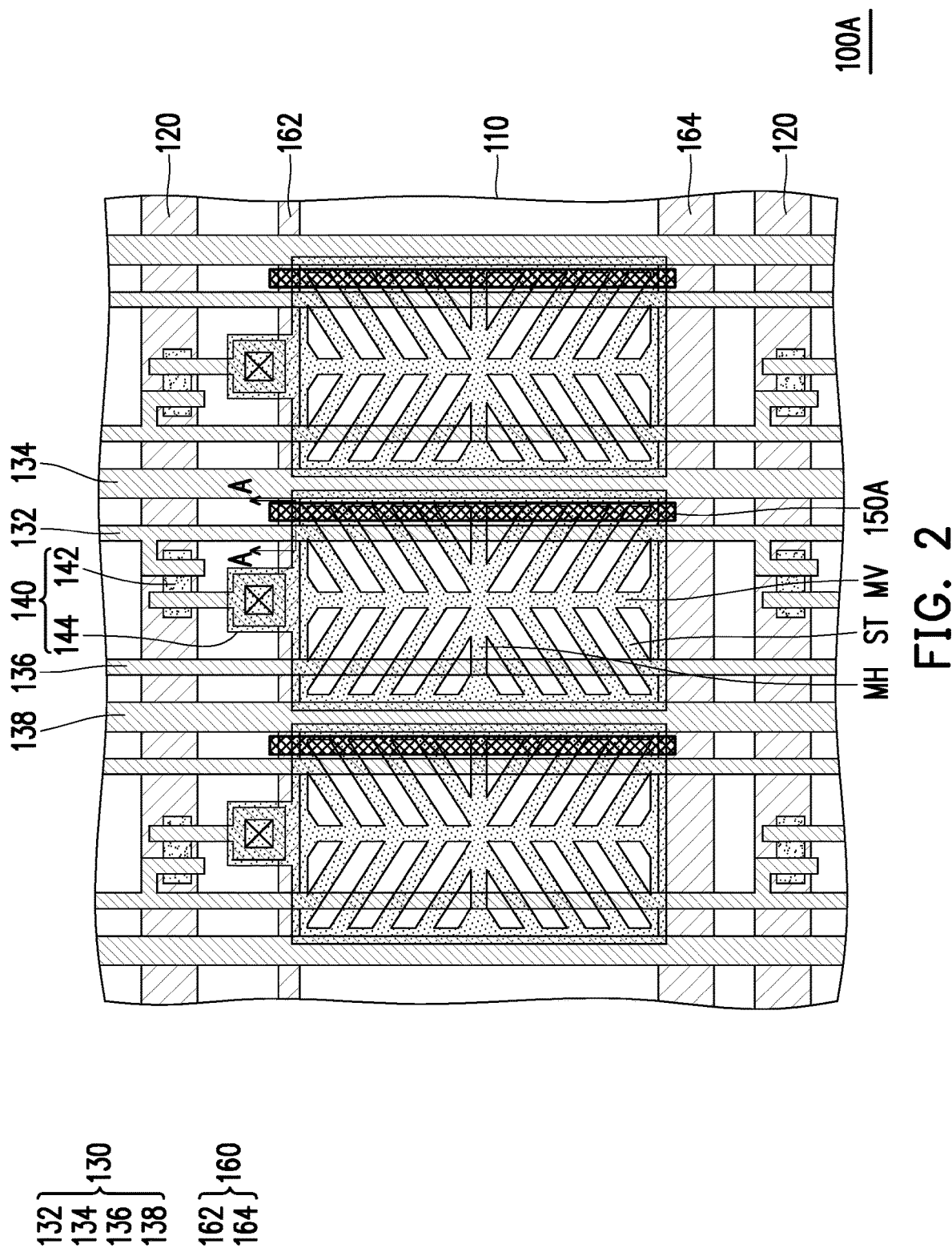
FIG. 2 is a partial schematic top view of an electronic device according to an embodiment of the disclosure.
Figure 11:
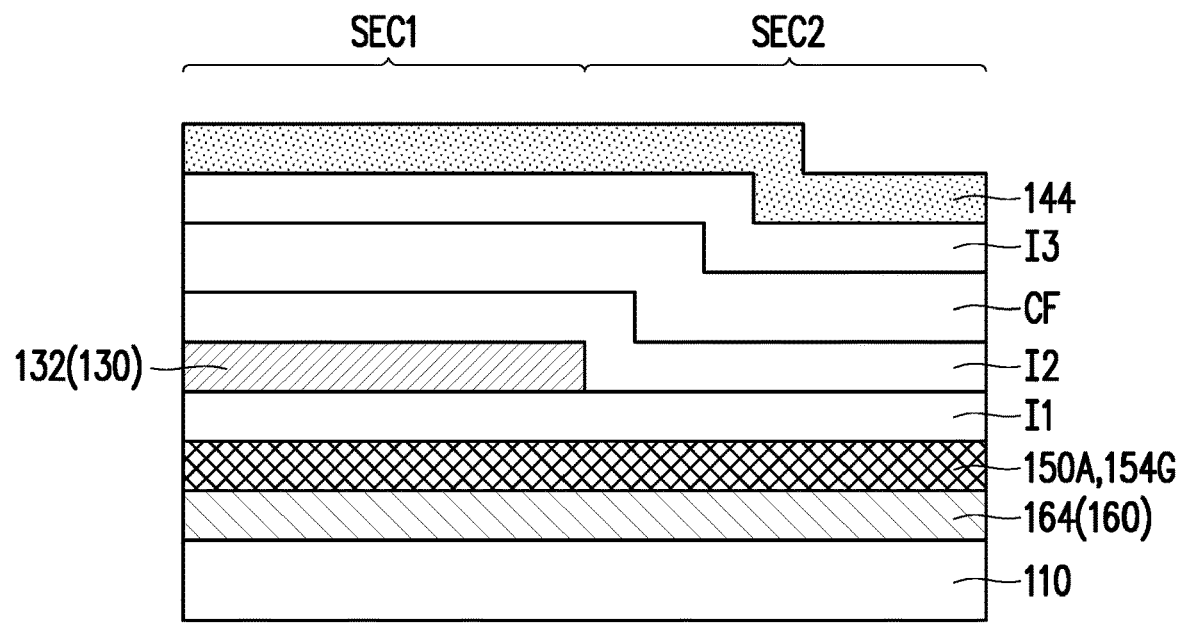

FIG. 11 is a schematic cross-sectional view of the electronic device of FIG. 2 along a section line B-B according to another embodiment of the disclosure.

Figure 12:
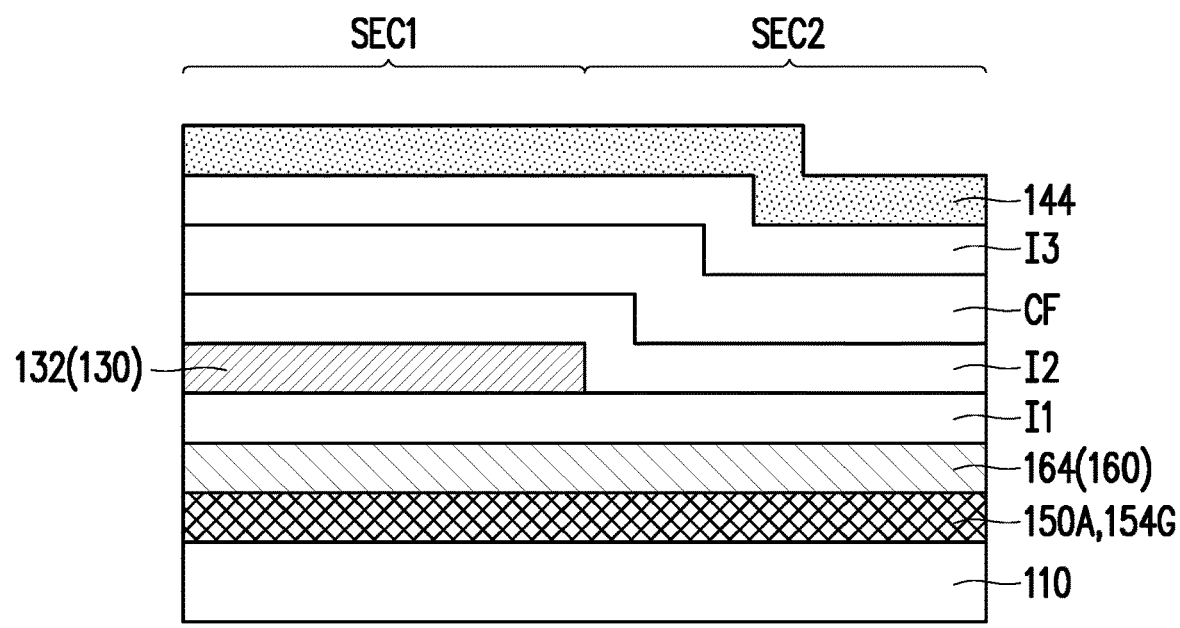

FIG. 12 is a schematic cross-sectional view of the electronic device of FIG. 2 along the section line B-B according to an embodiment of the disclosure.

Each of FIG. 13 to FIG. 19 is a partial schematic view of an electronic device according to an embodiment of the disclosure.

Figure 19:
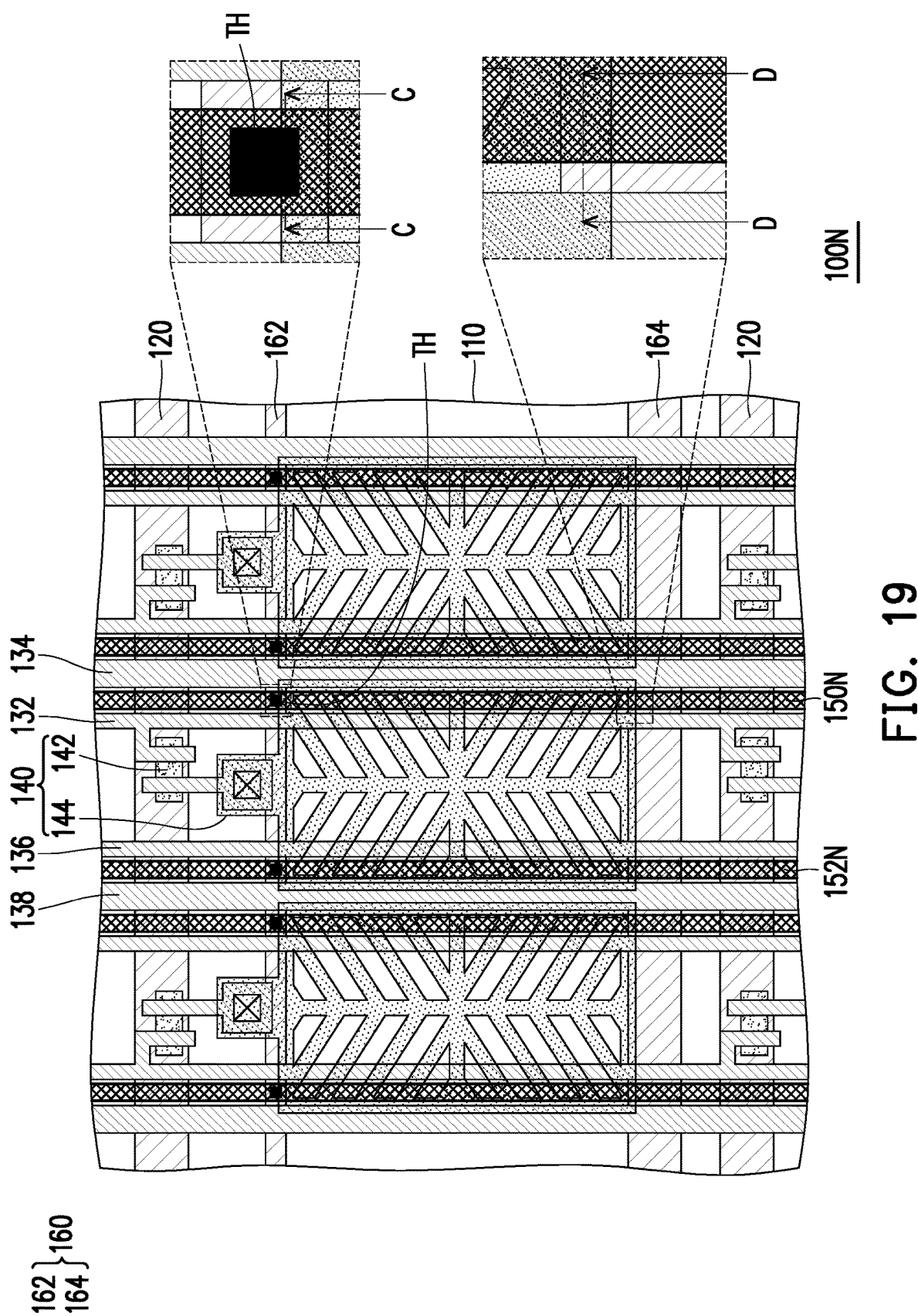
Figure 20:
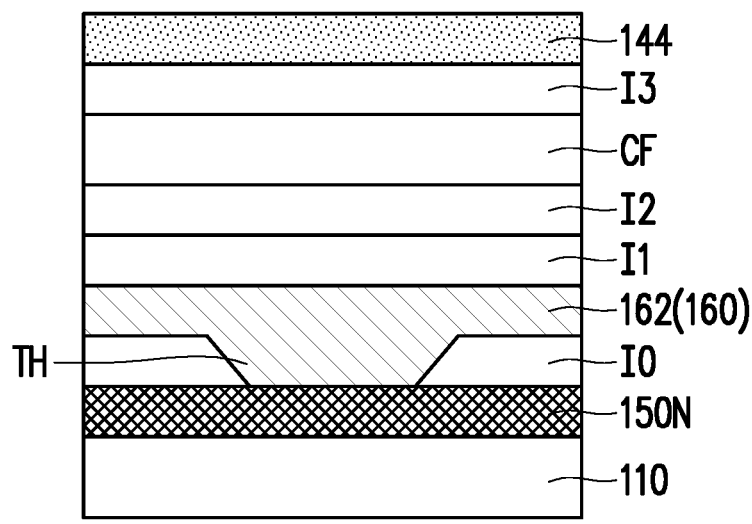

FIG. 20 is a schematic cross-sectional view illustrating a structure of the electronic device of FIG. 19 along a section line C-C according to an embodiment of the disclosure.

Figure 21:
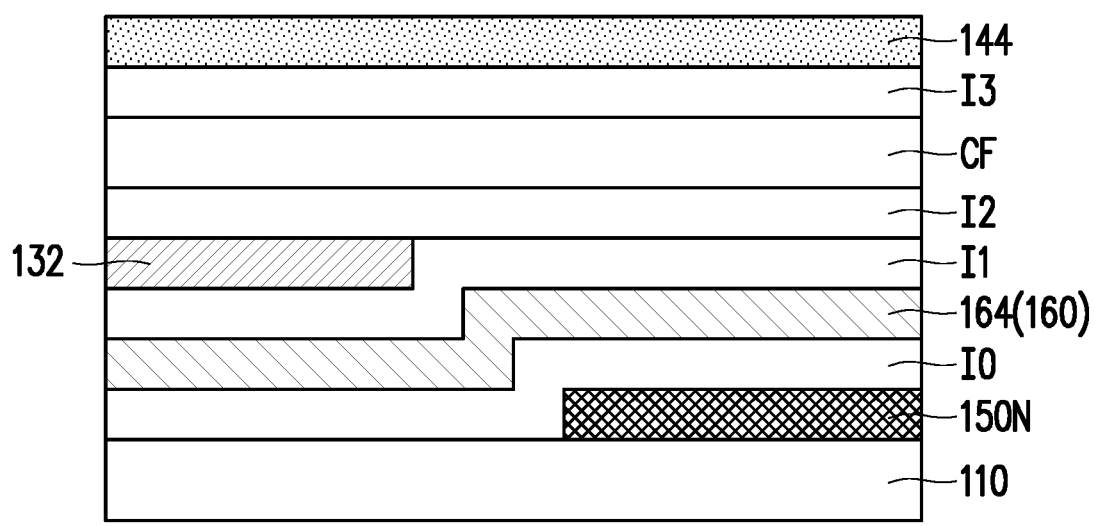

FIG. 21 is a schematic cross-sectional view illustrating a structure of the electronic device of FIG. 19 along a section line D-D according to an embodiment of the disclosure.

Figure 22:
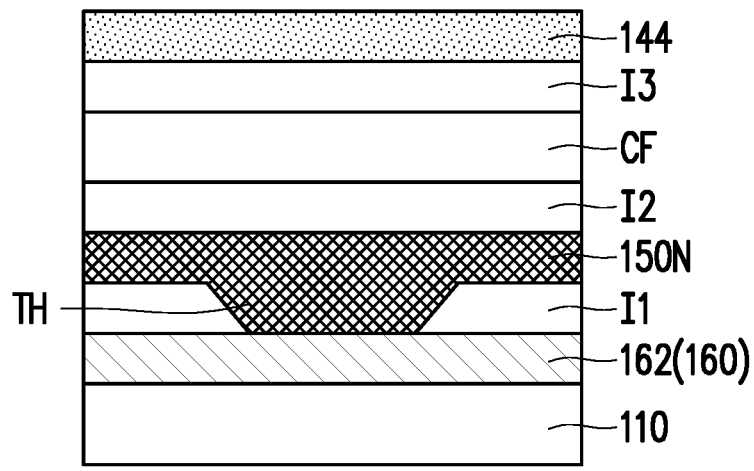

FIG. 22 is a schematic cross-sectional view illustrating a structure of the electronic device of FIG. 19 along the section line C-C according to another embodiment of the disclosure.

Figure 23:
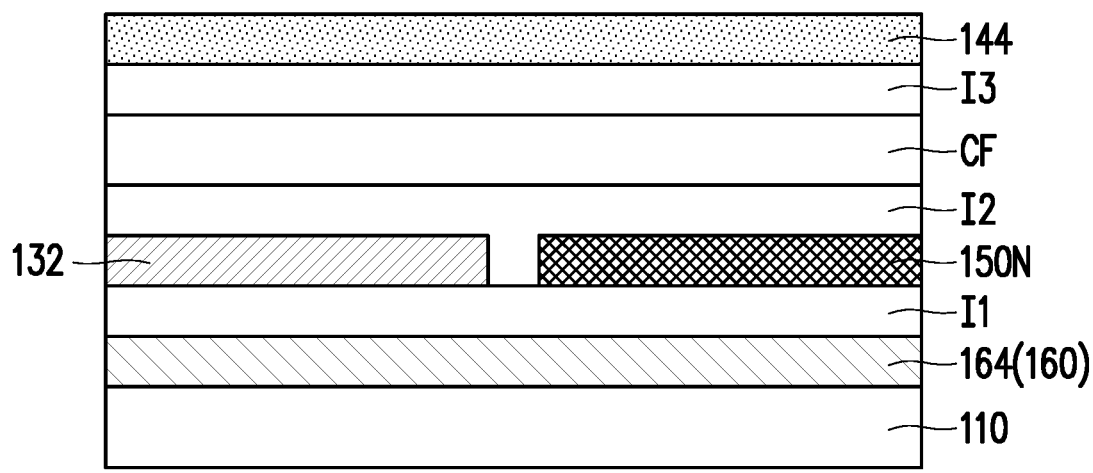

FIG. 23 is a schematic cross-sectional view illustrating a structure of the electronic device of FIG. 19 along the section line D-D according to another embodiment of the disclosure.

Figure 24:
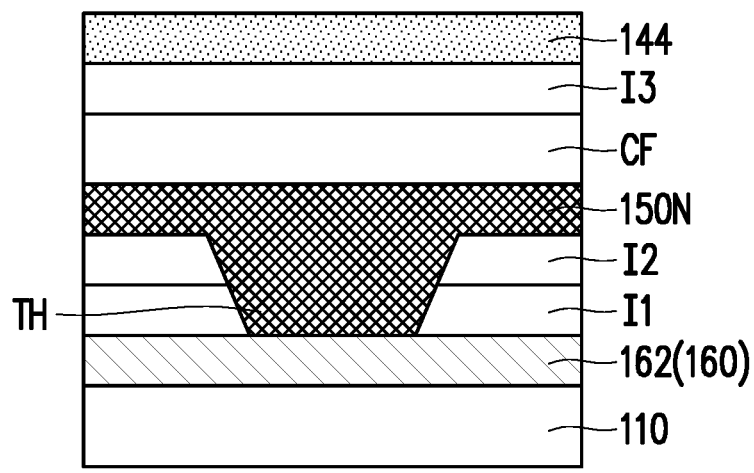

FIG. 24 is a schematic cross-sectional view illustrating a structure of the electronic device of FIG. 19 along the section line C-C according to still another embodiment of the disclosure.

Figure 25:
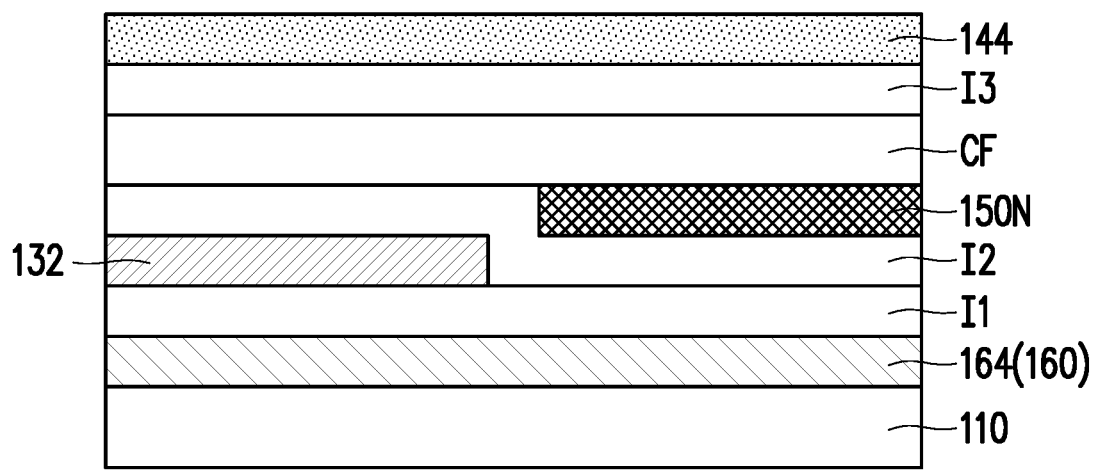

FIG. 25 is a schematic cross-sectional view illustrating a structure of the electronic device of FIG. 19 along the section line D-D according to still another embodiment of the disclosure.

Figure 26:
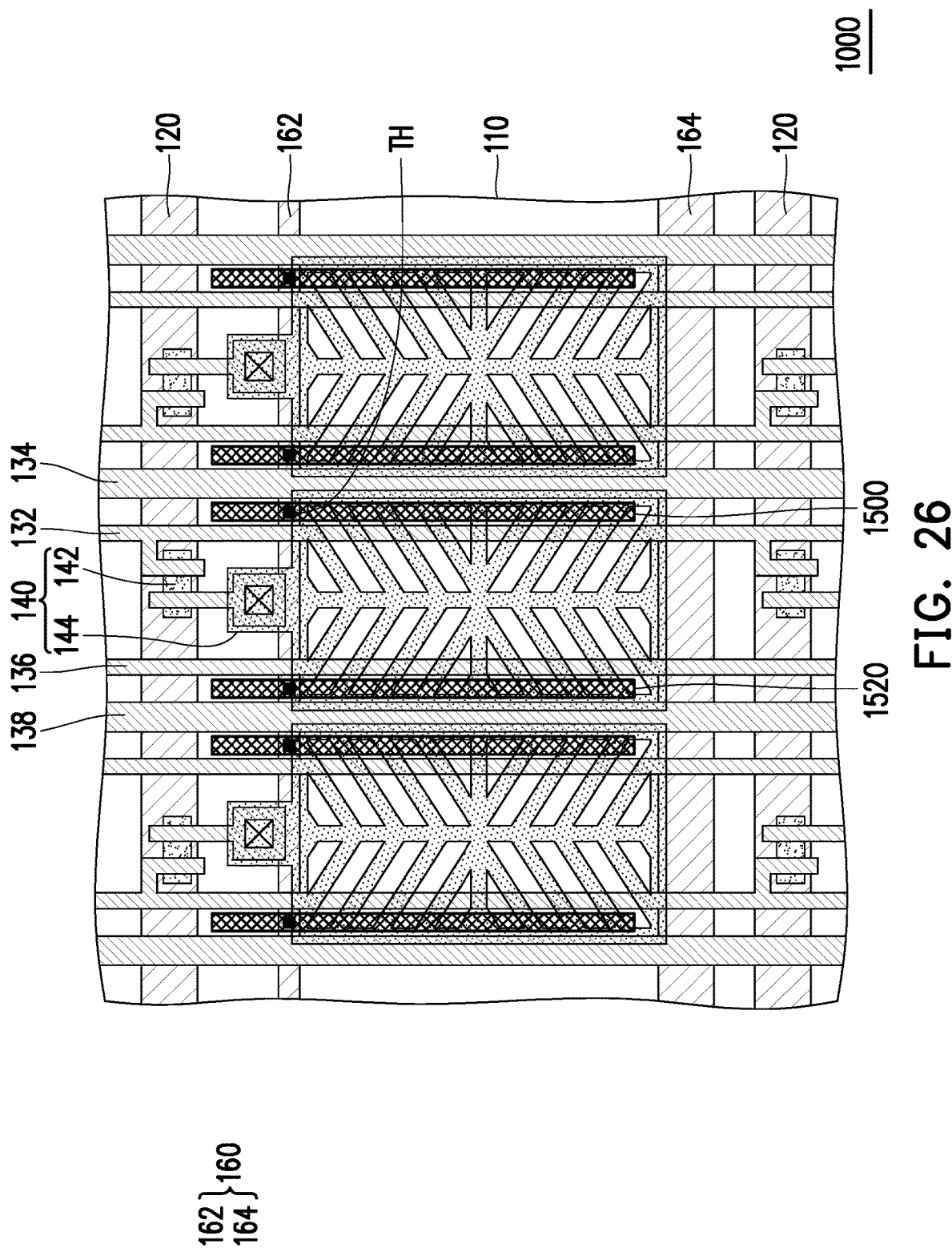

FIG. 26 is a schematic top view of an electronic device according to an embodiment of the disclosure.

Figure 27:
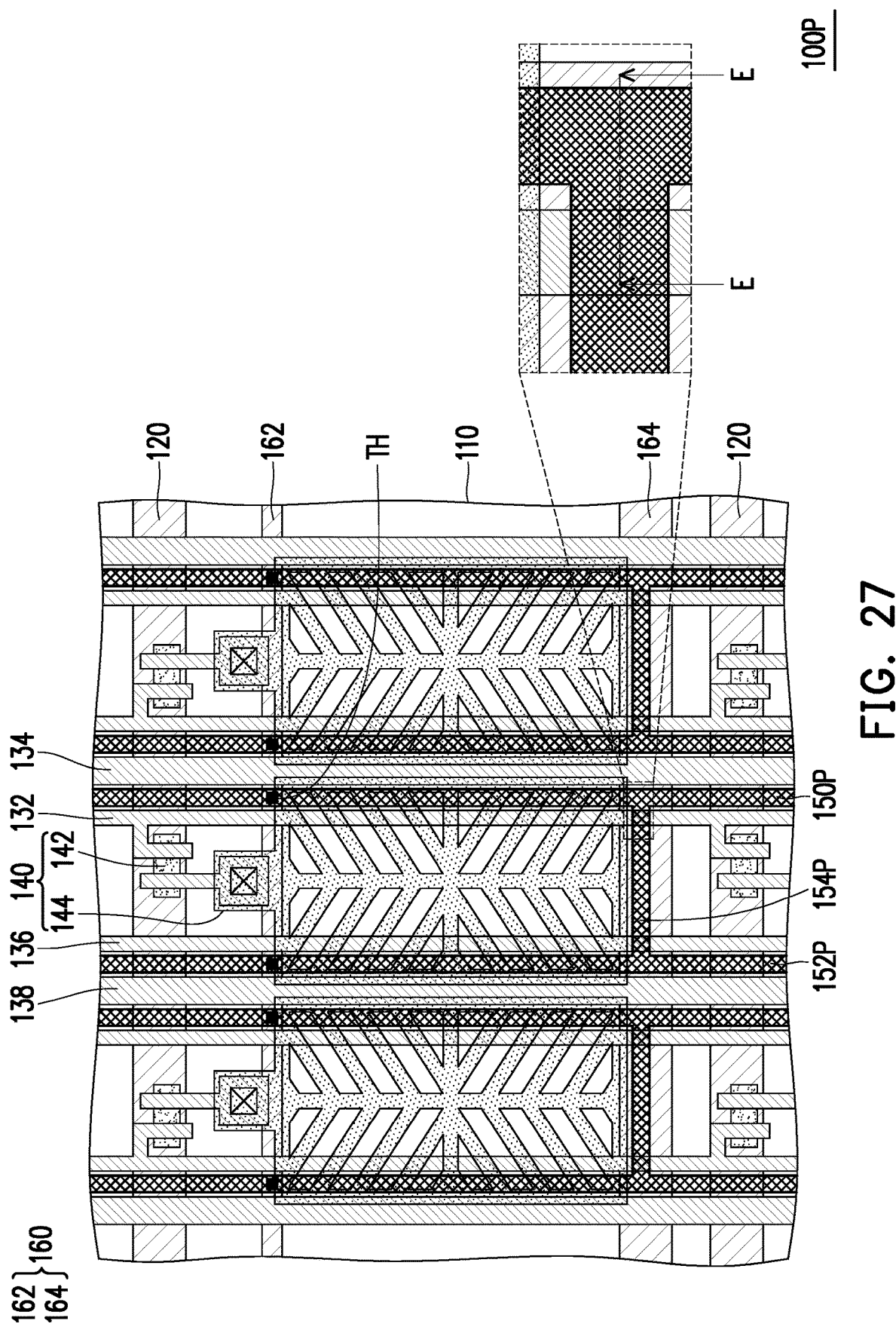

FIG. 27 is a schematic top view of an electronic device according to an embodiment of the disclosure.

Figure 28:
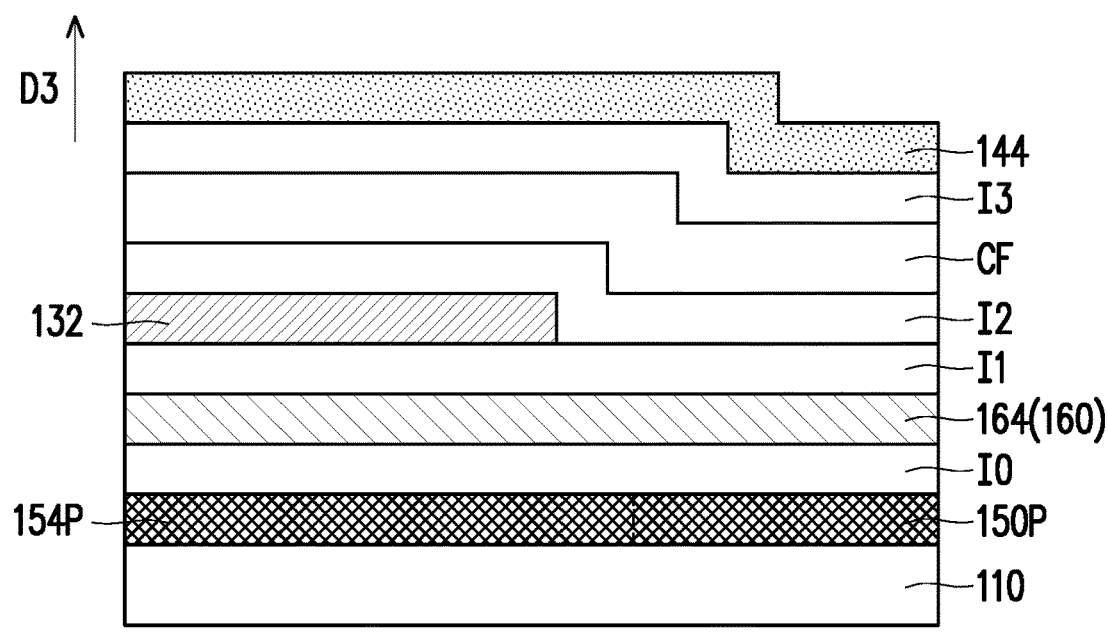

FIG. 28 is a schematic cross-sectional view illustrating a structure of the electronic device of FIG. 27 along a section line E-E according to an embodiment of the disclosure.

Figure 29:
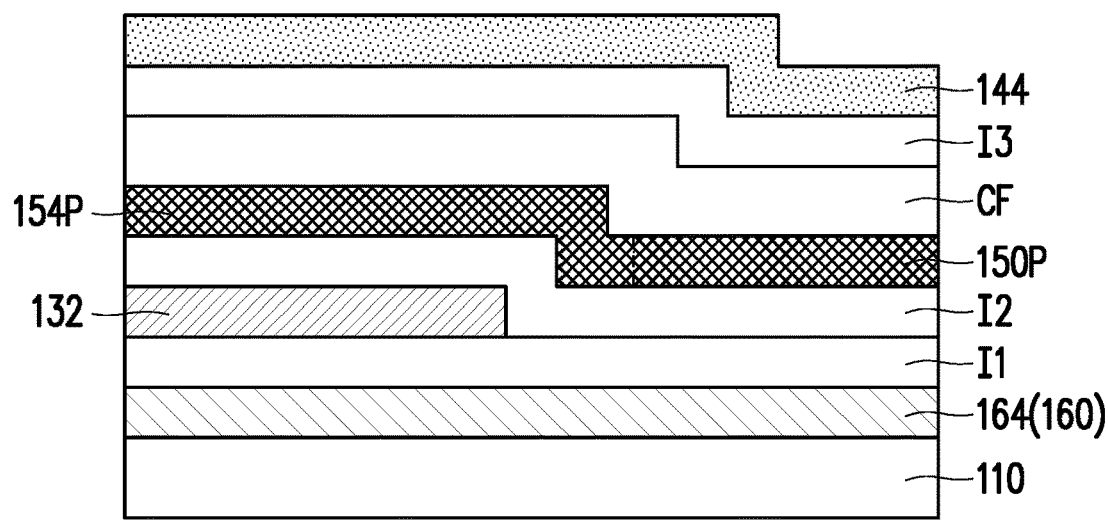

FIG. 29 is a schematic cross-sectional view illustrating a structure of the electronic device of FIG. 27 along a section line E-E according to an embodiment of the disclosure.

Figure 30:
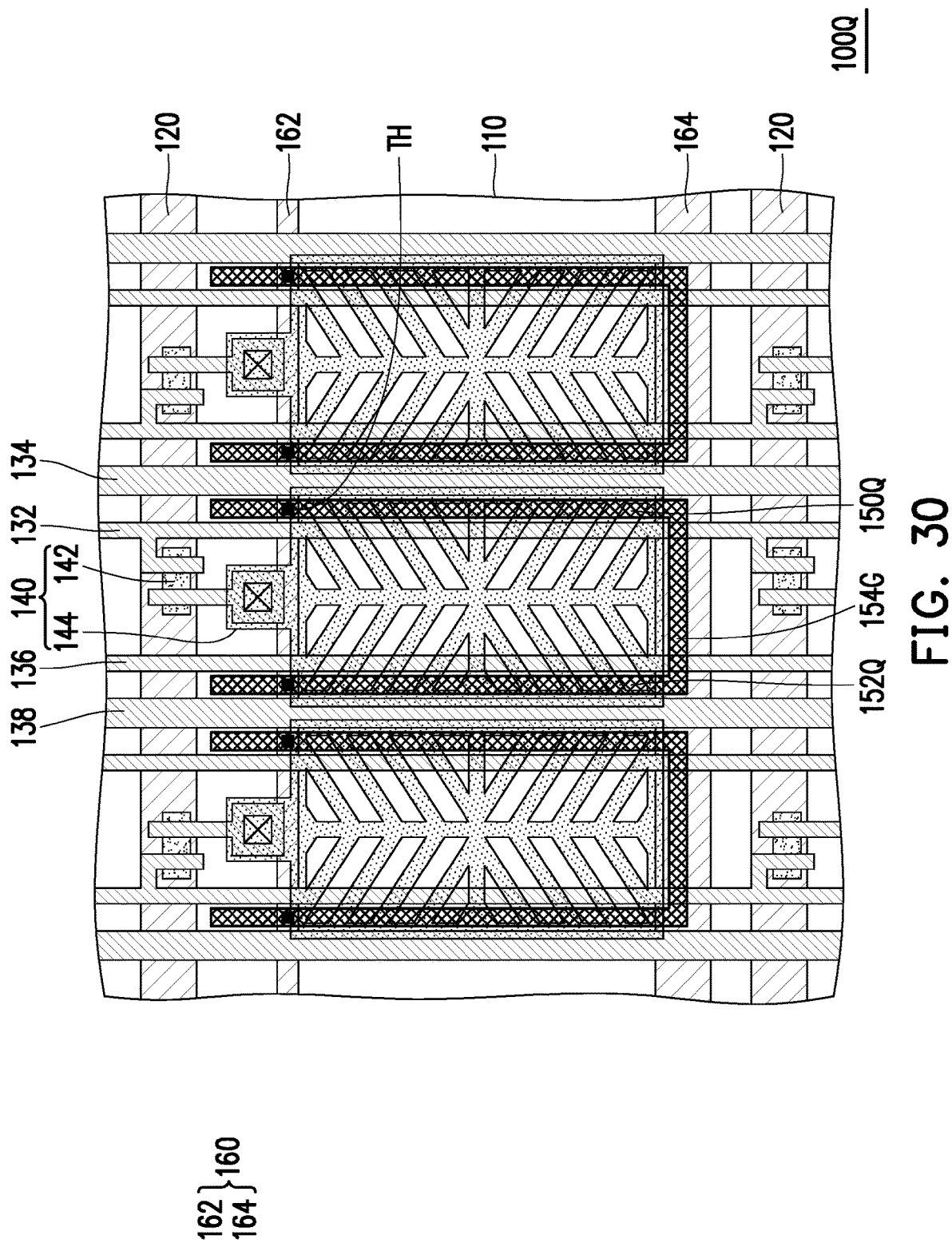

FIG. 30 is a partial schematic top view of an electronic device according to an embodiment of the disclosure.

Figure 31:
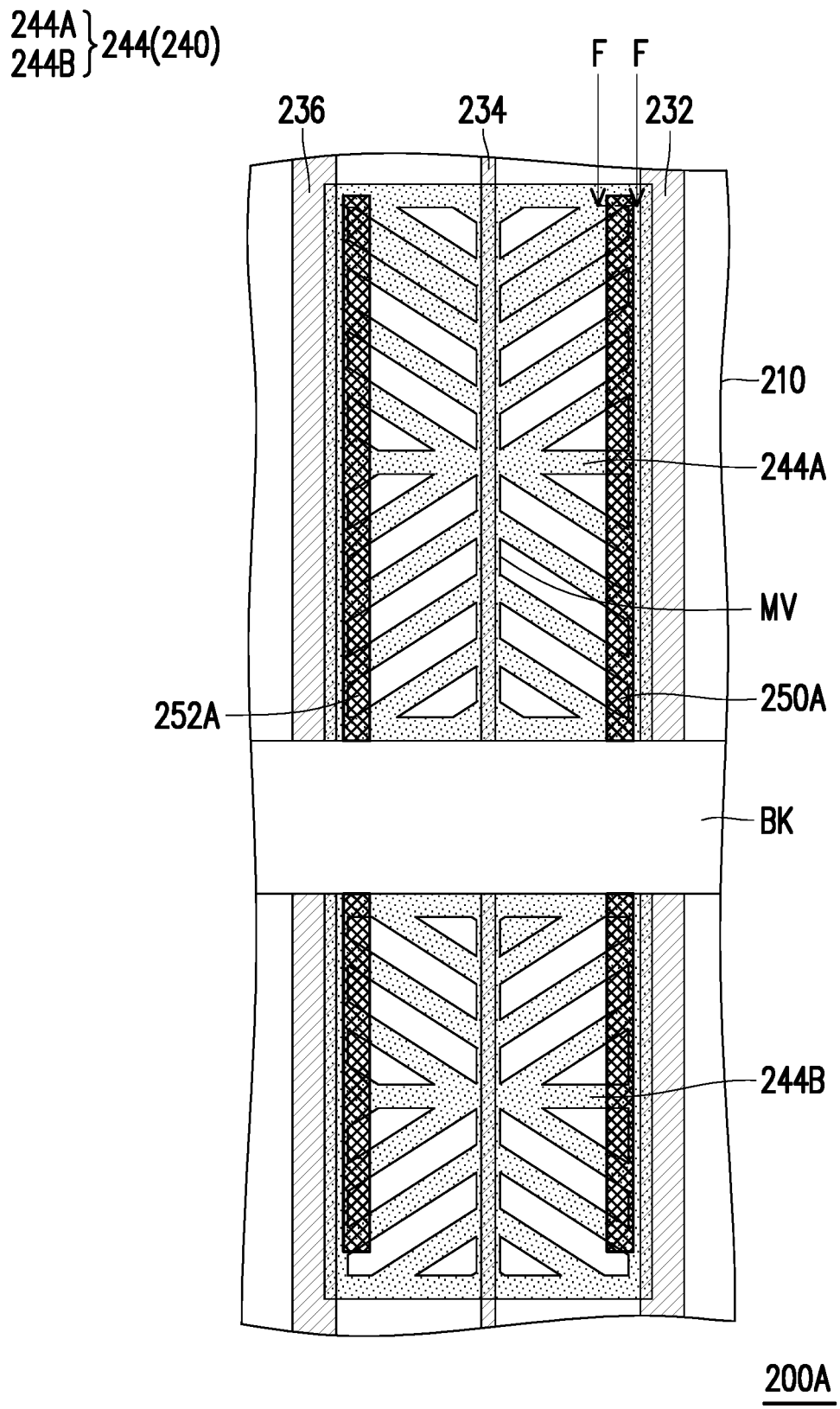

FIG. 31 is a partial schematic top view of an electronic device according to an embodiment of the disclosure.

Figure 32:
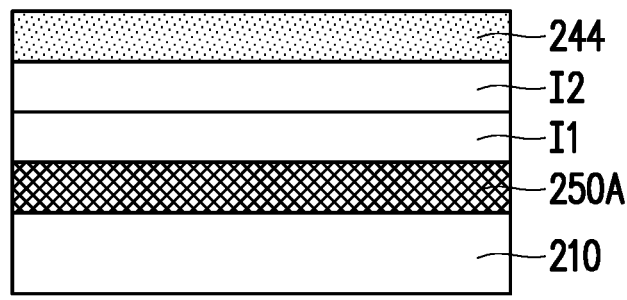

FIG. 32 is a schematic cross-sectional view illustrating a structure of a first shielding vertical line 250A in an electronic device 200A of FIG. 31 according to embodiment of the disclosure.

Figure 33:
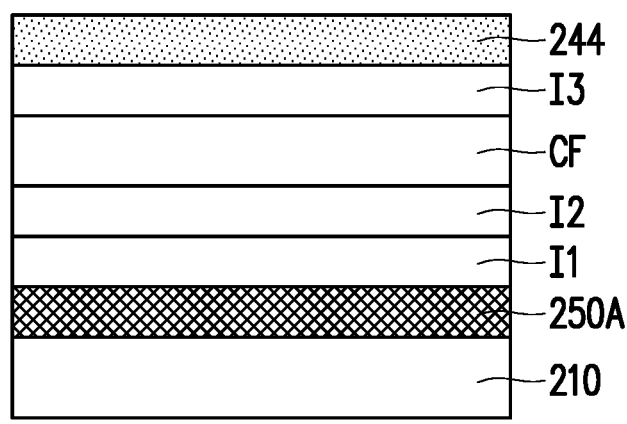

FIG. 33 schematic cross-sectional view illustrating a structure of the first shielding vertical line 250A in the electronic device 200A of FIG. 31 according to another embodiment of the disclosure.

Figure 34:
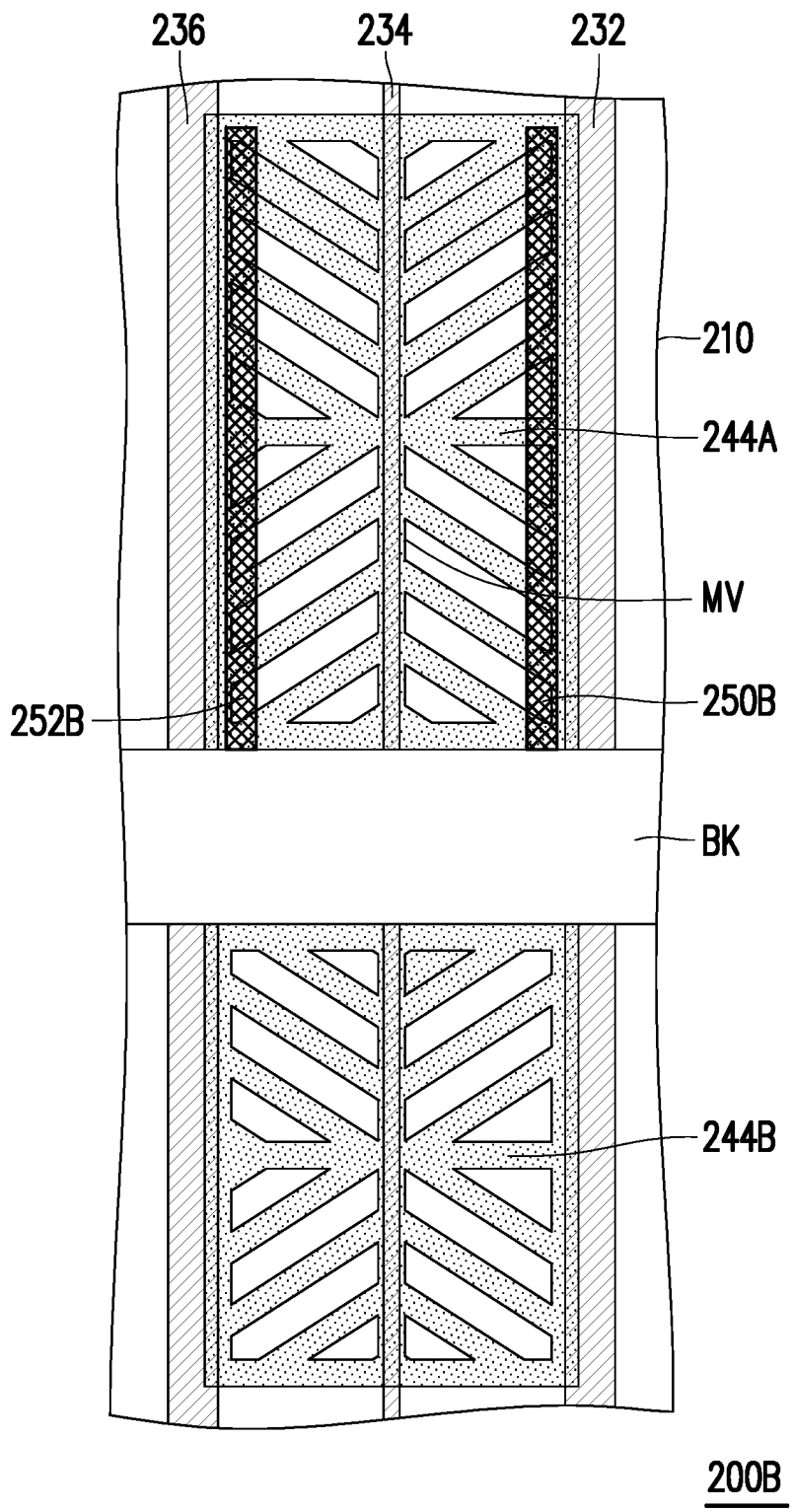
Figure 35:
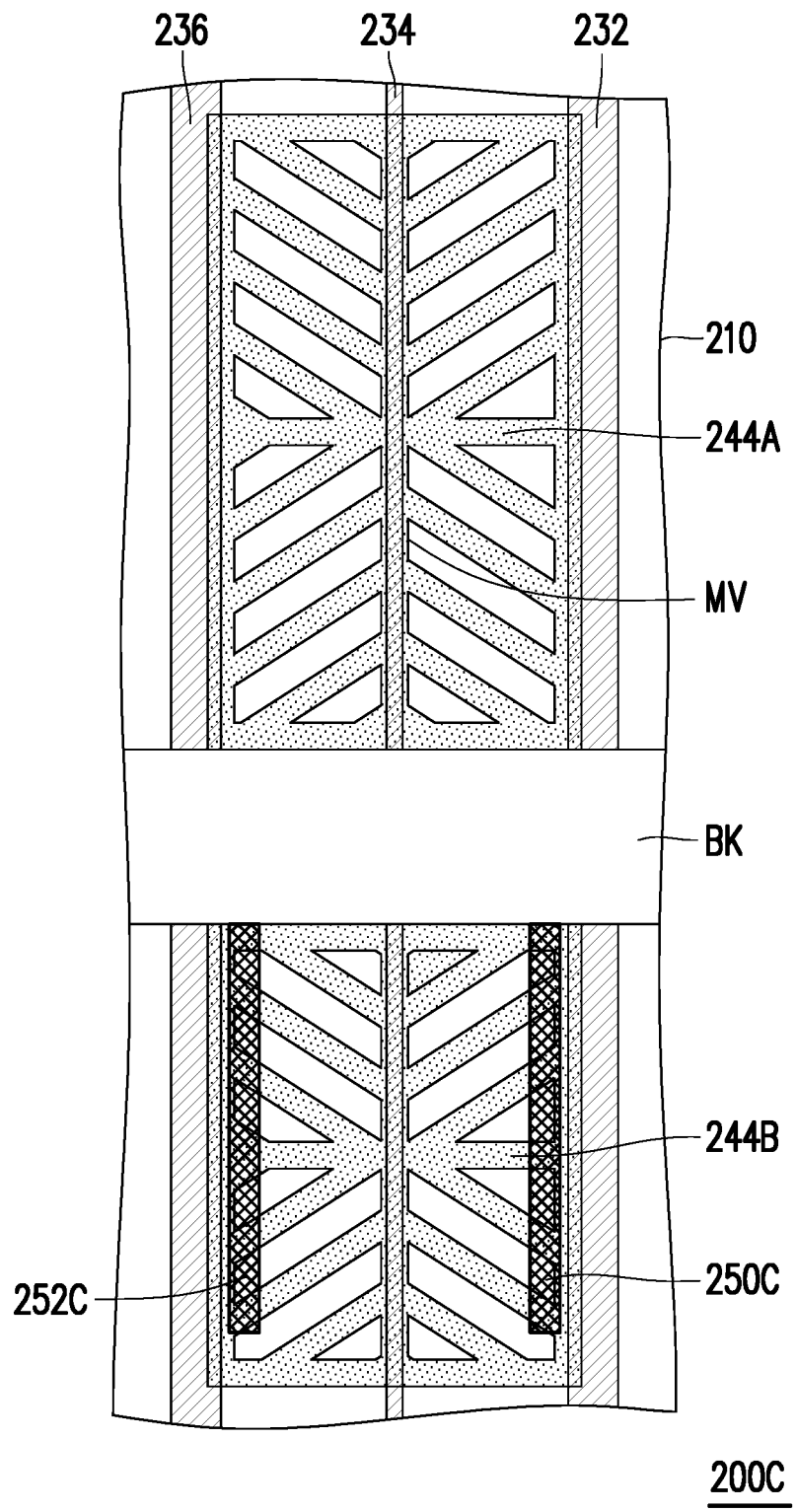
Figure 36:
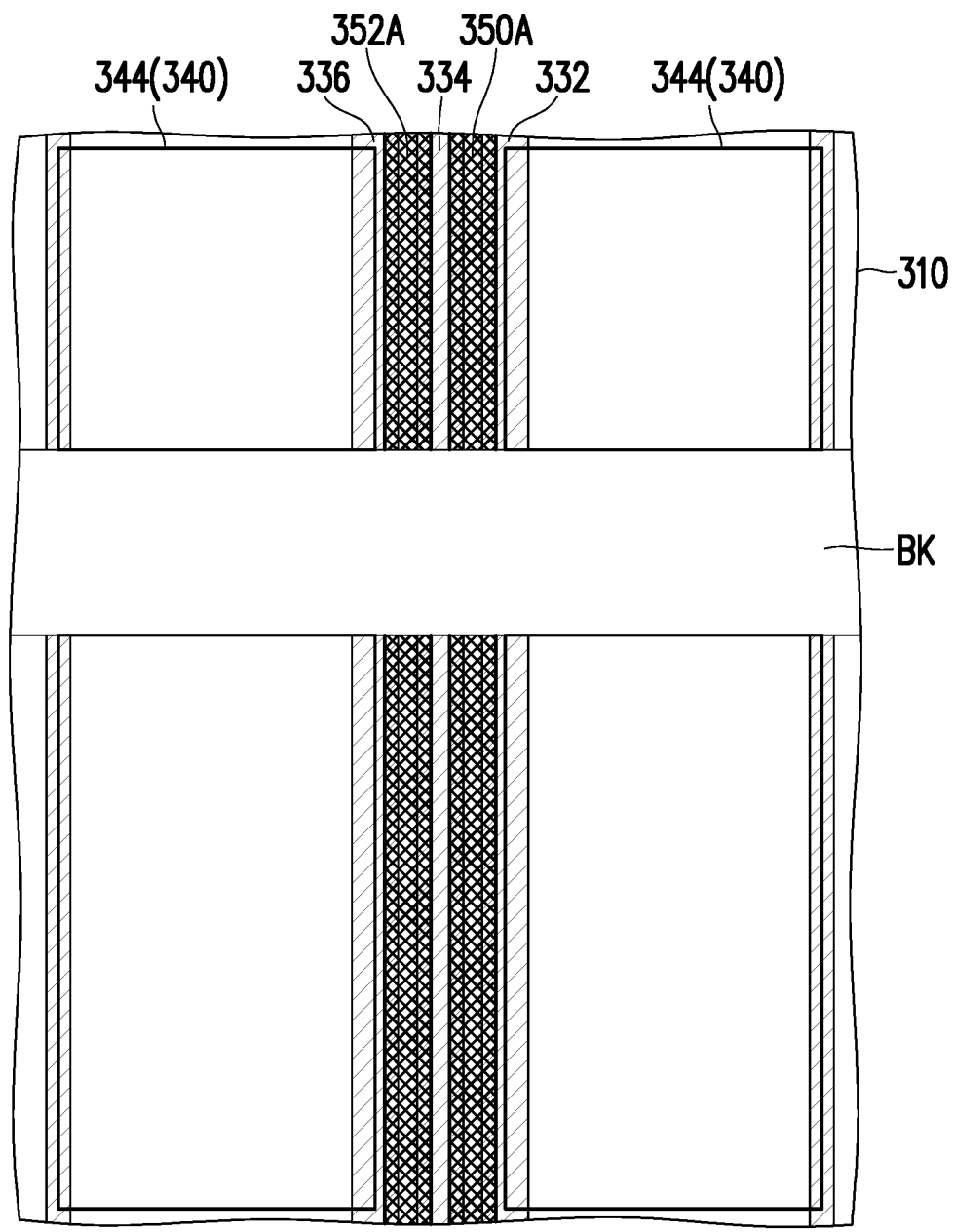

Each of FIG. 34 to FIG. 36 is a partial schematic top view of an electronic device according to an embodiment of the disclosure.

Figure 37:
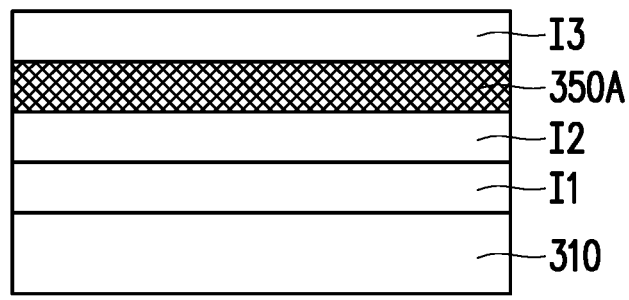

FIG. 37 is a schematic cross-sectional view illustrating a structure of a first shielding vertical line 350A in an electronic device 300 according to an embodiment of the disclosure.

Figure 38:
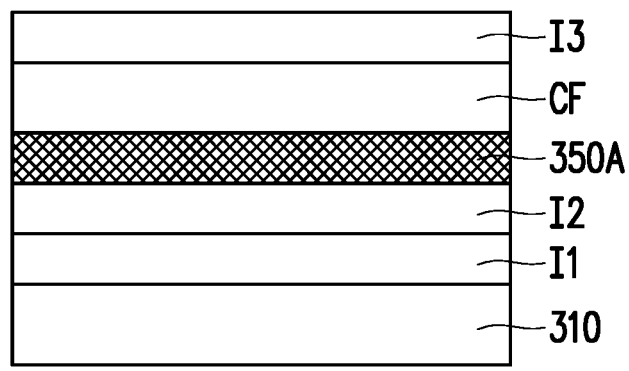

FIG. 38 is a schematic cross-sectional view illustrating a structure of the first shielding vertical line 350A in the electronic device 300 according to another embodiment of the disclosure.

Figure 39:
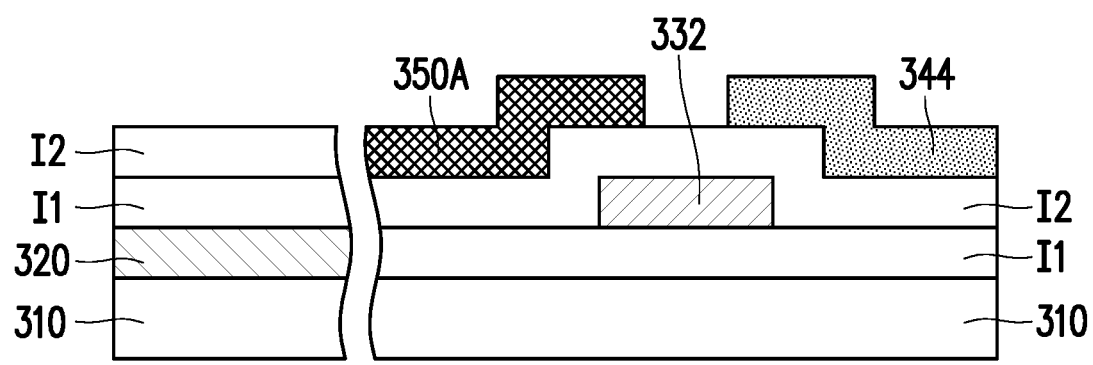

FIG. 39 is a schematic cross-sectional view illustrating a structure of the electronic device 300 according to another embodiment of the disclosure.

DESCRIPTION OF THE EMBODIMENTS

Figure 1:
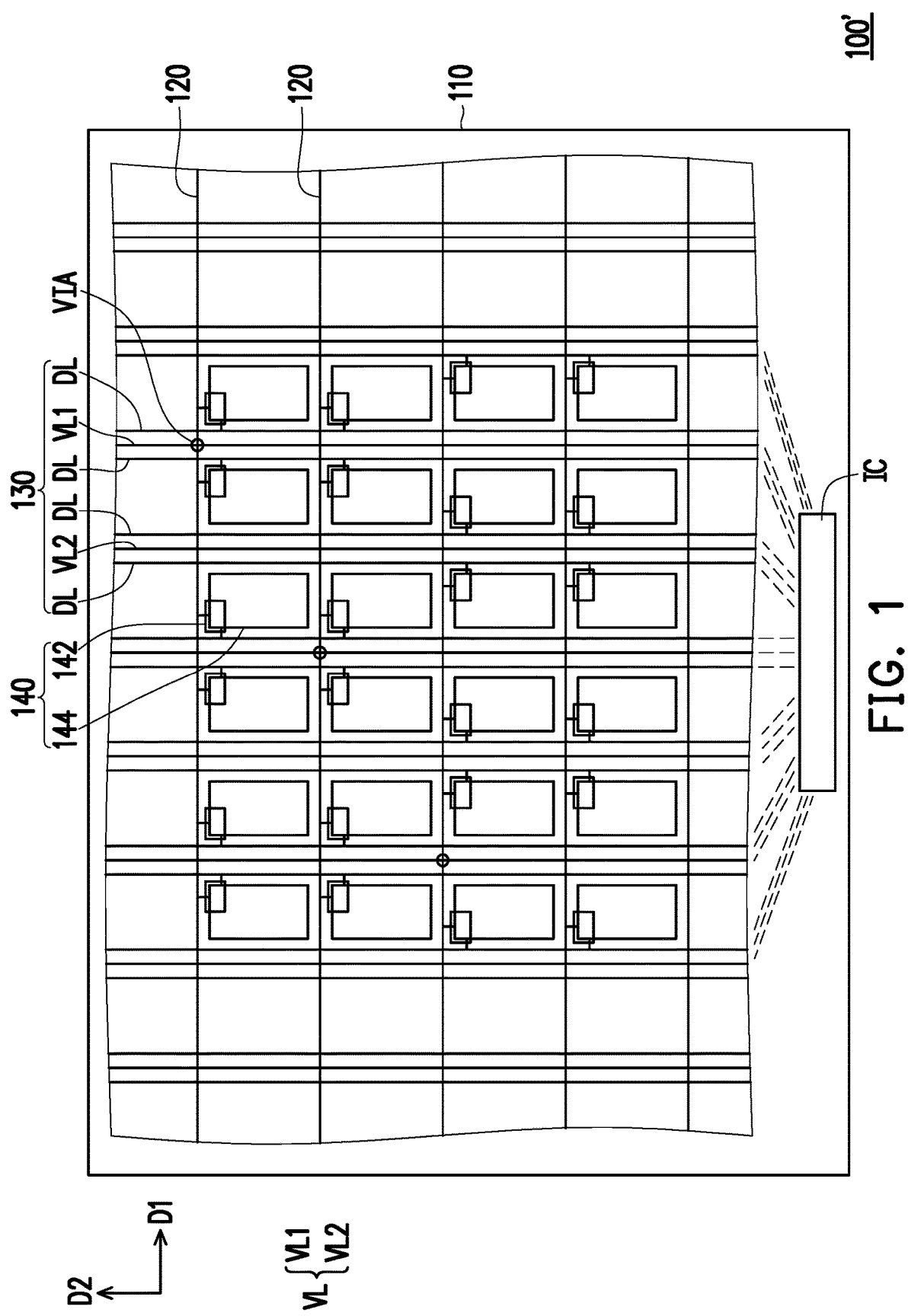
FIG. 1 is a partial schematic top view of an electronic device.

FIG. 1 is a partial schematic top view of an electronic device. In FIG. 1, an electronic device 100' includes a substrate 110, a plurality of transversal signal lines 120, a plurality of vertical signal lines 130, and a plurality of pixel structures 140. The pixel structures 140 are arranged on the substrate 110 in an array. In other words, the pixel structures 140 are arranged in an array along a first direction D1 and a second direction D2 intersected with the first direction D1, where the first direction D1 may be interpreted as a transversal direction, and the second direction D2 may be interpreted as a vertical direction. Therefore, the transversal and vertical directions described in the following embodiments may be respectively regarded as the first direction D1 and the second direction D2 in FIG. 1. Each of the pixel structures 140 is connected to one of the transversal signal lines 120. In addition, the vertical signal lines 130 may be divided into vertical signal lines DL directly connected to the pixel structures 140 and vertical signal lines VL not directly connected to the pixel structures 140. The pixel structures 140 arranged in a column along the second direction D2 are sandwiched between two vertical signal lines DL, and each of the pixel structures 140 is connected to one of the vertical signal lines DL. In some embodiments, the different pixel structures 140 arranged in the same column along the second direction D2 may be respectively connected to the vertical signal line DL on a first side and the vertical signal line DL on an opposite second side. Each of the vertical signal lines VL is sandwiched between two columns of the pixel structures 140 and two of the vertical signal lines DL. In some embodiments, the vertical signal lines VL include vertical signal lines VL1 connected to the transversal signal line 120 through corresponding conducting structures VIA, but the disclosure is not limited thereto.

In some embodiment, each of the pixel structures 140 may include an active device 142 and a pixel electrode 144 connected to the active device 142, where each active device 142 may be a transistor having a gate, a source, and a drain, and the gate may be connected to one of the transversal signal lines 120, the source is connected to one of the vertical signal lines DL, and the drain is connected to the pixel electrode 144. Moreover, each of the transversal signal lines 120 is connected to one of the vertical signal lines VL1. Therefore, a signal of the gate of the active device 142 may be transmitted from the vertical signal line VL1 to the transversal signal line 120, and then input to the gate by the transversal signal line 120. To be specific, in order to avoid a short circuit between the transversal signal lines 120 and the vertical signal lines 130, the transversal signal lines 120 and the vertical signal lines 130 may be formed by different film layers, and there may be one or a plurality of insulating layers sandwiched between the transversal signal lines 120 and the vertical signal lines 130. In some embodiments, in order to transmit the signal from the vertical signal line VL1 to the transversal signal line 120, the conducting structure VIA may be configured between the corresponding vertical signal line VL1 and the transversal signal line 120. In this way, the signal required by the gate may be transmitted to the transversal signal line 120 from the vertical signal line VL1 through the conducting structure VIA, and then transmitted to the gate from the transversal signal line 120.

In some embodiments, the electronic device 100' may further include a driving circuit IC, and the driving circuit IC is located at one end of the vertical signal line 130. The vertical signal lines DL and the vertical signal lines VL1 may directly receive signals provided by the driving circuit IC, and the transversal signal lines 120 may receive the corresponding signals through the vertical signal lines VL1. In this way, it is unnecessary to configure wires or related circuits used for transmitting signals at two ends of the electronic device 100' in the first direction D1, so as to achieve a narrow border design, and a contour of the electronic device 100' is not limited. For example, from a top-view perspective, the electronic device 100' may have a non-rectangular contour. In some embodiments, the vertical signal lines VL in the electronic device 100' may further include vertical signal lines VL2, and the vertical signal lines VL2 may not be used to transmit the signals required by the transversal signal lines 120, but may be input with a DC potential. For example, the vertical signal lines VL2 may not be connected to any transversal signal line 120, but may be used for implementing touch control or other functions.

FIG. 2 is a partial schematic top view of an electronic device according to an embodiment of the disclosure. An electronic device 100A of FIG. 2 has a layout design substantially similar to that of the electronic device 100' of FIG. 1, so that the same component symbols are adopted in the two embodiments to denote the same components. In FIG. 2, the electronic device 100A includes the substrate 110, a plurality of the transversal signal lines 120, a plurality of the vertical signal lines 130, a plurality of the pixel structures 140, and a plurality of first shielding vertical lines 150A, and the transversal signal lines 120, the vertical signal lines 130, the pixel structures 140, the first shielding vertical lines 150A and a common electrode line 160 are all disposed on the substrate 110. A layout and a connection relationship of the transversal signal lines 120, the vertical signal lines 130, and the pixel structures 140 are, for example, as shown in FIG. 1, and are not repeated here. For the convenience of description, the signal lines around the single pixel structure 140 located in the middle of FIG. 2 are mainly described below.

In the embodiment, an extending direction of the transversal signal lines 120 is, for example, the first direction D1 shown in FIG. 1, and an extending direction of the vertical signal lines 130 is, for example, the second direction D2 shown in FIG. 1, where the transversal and vertical directions are intersected with each other, but an intersection angle of the two directions is not limited to 90 degrees. The vertical signal lines 130 may include a first vertical signal line 132 and a second vertical signal line 134 on one side of the pixel structure 140, where the first vertical signal line 132 is a vertical signal line directly connected to one of the pixel structures 140, and the second vertical signal line 134 may be connected to one of the transversal signal lines 120 in the entire electronic device 100A. One of the pixel structures 140 is located between adjacent two of the transversal signal lines 120 and is located on one side of the second vertical signal line 134. The single pixel structure 140 may include the active device 142 and the pixel electrode 144, where three terminals of the active device 142 are respectively connected to the corresponding transversal signal line 120, the first vertical signal line 132, and the pixel electrode 144.

The transversal signal lines 120 are, for example, scan signal lines, which are configured to provide scan signals to the pixel structures 140, and the first vertical signal line 132 is configured to provide a data signal to the pixel structure 140. In other words, although the first vertical signal line 132 and the second vertical signal line 134 are adjacent to each other, they are used to transmit different types of signals. Under such circuit configuration, coupling of the first vertical signal line 132 and the second vertical signal line 134 may probably decrease signal transmission quality of the two vertical signal lines 132 and 134. However, in the embodiment, an orthogonal projection of the first shielding vertical line 150A on the substrate 110 (i.e., a layout area in FIG. 2) is located between an orthogonal projection of the first vertical signal line 132 on the substrate 110 and an orthogonal projection of the second vertical signal line 134 on the substrate 110. Moreover, the electronic device 100A may further include the common electrode line 160, and the first shielding vertical line 150A may be connected to the common electrode line 160 to be applied with a common potential. In this way, the arrangement of the first shielding vertical line 150A may reduce the interference between the first vertical signal line 132 and the second vertical signal line 134 to ensure the signal transmission quality of the first vertical signal line 132 and the second vertical signal line 134, so that functions (such as image display, touch sensing, etc.) executed by the electronic device 100A may meet expectations. In FIG. 2, the common electrode line 160 includes a first line 162 and a second line 164, where the first line 162 and the second line 164 are located between two adjacent horizontal signal lines 120 and located on opposite sides of the pixel structure 140. In addition, the first shielding vertical line 150A may be overlapped with both the first line 162 and the second line 164, but the disclosure is not limited thereto.

In the embodiment, the vertical signal lines 130 may further include a third vertical signal line 136 and a fourth vertical signal line 138 located on the other side of the pixel structure 140. The pixel structure 140 is, for example, located between the second vertical signal line 134 and the fourth vertical signal line 138. The third vertical signal line 136 is located between the fourth vertical signal line 138 and the first vertical signal line 132. Moreover, orthogonal projections of the first vertical signal line 132 and the third vertical signal line 136 on the substrate 110 are located between the orthogonal projection of the second vertical signal line 134 on the substrate 110 and an orthogonal projection of the fourth vertical signal line 138 on the substrate 110. In addition, the shielding vertical line may not be provided between the third vertical signal line 136 and the fourth vertical signal line 138, but the disclosure is not limited thereto. The third vertical signal line 136 is connected to other pixel structures in the same column, and the fourth vertical signal line 138 may be connected to a DC potential or one of the transversal signal lines 120 in the entire electronic device 100A, but the disclosure is not limited thereto.

In the embodiment, the pixel electrode 144 of the pixel structure 140 may be overlapped with the first vertical signal line 132, the second vertical signal line 134, the third vertical signal line 136, the fourth vertical signal line 138 and the first shielding vertical line 150A in a direction perpendicular to the substrate 110. To be specific, the pixel electrode 144 may traverse the first vertical signal line 132, the first shielding vertical line 150A, and the third vertical signal line 136, and may be overlapped with the second vertical signal line 134 by a part of width of the second vertical signal line 134 and overlapped with the fourth vertical signal line 138 by a part of width of the fourth vertical signal line 138. The first shielding vertical line 150A may be a transparent wire, so that the portion of the pixel electrode 144 overlapped with the first shielding vertical line 150A may still serve as an effective display area. In this way, although the electronic device 100A is additionally configured with the first shielding vertical line 150A, a display area of the electronic device 100A is not reduced due to configuration of the first shielding vertical line 150A.

Moreover, in the embodiment, the pixel electrode 144 may include a vertical trunk portion MV, a horizontal trunk portion MH, and a plurality of stripe portions ST, where the vertical trunk portion MV and the horizontal trunk portion MH are intersected in a cross shape to define four sub-regions, and the stripe portions ST are connected to the vertical trunk portion MV and the horizontal trunk portion MH and extend outward from the vertical trunk portion MV and the horizontal trunk portion MH in a substantially radial manner. However, in other embodiments, the pixel electrode 144 may have other patterns or may be regarded as a complete rectangular shape.

Figure 3:
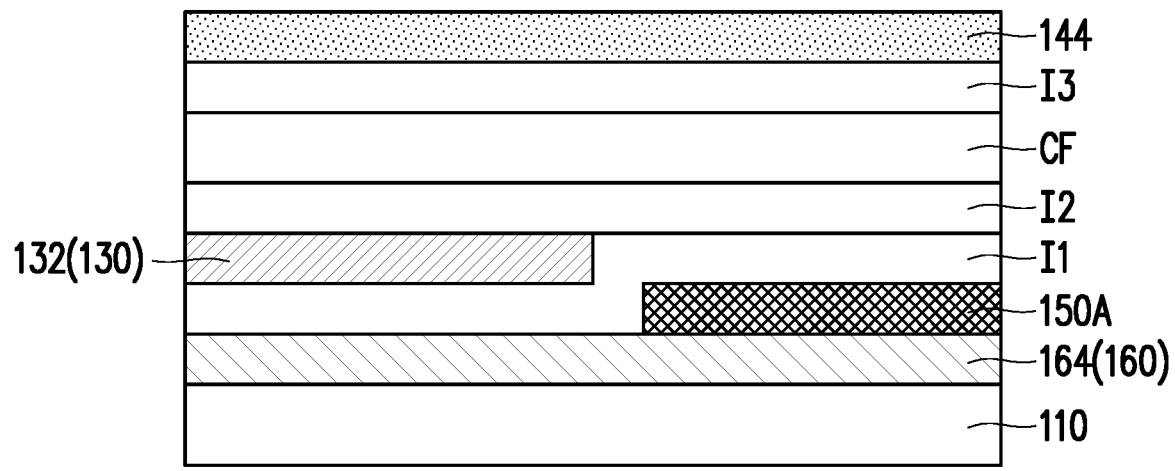
FIG. 3 is a schematic cross-sectional view of the electronic device of FIG. 2 along a section line A-A according to an embodiment of the disclosure.

FIG. 3 is a schematic cross-sectional view of the electronic device of FIG. 2 along a section line A-A according to an embodiment of the disclosure. Referring to FIG. 2 and FIG. 3, the common electrode line 160 is disposed on the substrate 110. In the embodiment, a film layer where the common electrode line 160 is located may be the same as a film layer where the transversal signal lines 120 are located. Materials of the common electrode line 160 and the transversal signal lines 120 include a material with good conductivity, such as metal or alloy. The film layer where the common electrode line 160 and the transversal signal lines 120 are located is, for example, closer to the substrate 110 than film layers where other circuits are located, but the disclosure is not limited thereto.

After the common electrode line 160 and the transversal signal lines 120 are fabricated, another conductive layer may be directly formed to fabricate the first shielding vertical line 150A, so that the first shielding vertical line 150A is directly stacked on the common electrode line 160. In other words, the first shielding vertical line 150A directly contacts the common electrode line 160 without an intermediate layer. The first shielding vertical line 150A may be a transparent conductive pattern. A material of the first shielding vertical line 150A may be metal oxide, for example: indium tin oxide, indium zinc oxide, aluminum tin oxide, aluminum zinc oxide, indium germanium zinc oxide, or other suitable oxides, or a stacked layer of at least two of the above materials. Alternatively, the material of the first shielding vertical line 150A may be an organic transparent conductive material. In some embodiments, since the material of the first shielding vertical line 150A and the material of the common electrode line 160 have different properties, it is less likely to damage the common electrode line 160 and the transversal signal lines 120 during a patterning process of the first shielding vertical line 150A. Therefore, the first shielding vertical line 150A may be directly stacked on the common electrode line 160 without the intermediate layer.

After the first shielding vertical line 150A is fabricated, an insulating layer I1 may be formed on the substrate 110, and then the vertical signal lines 130 are fabricated. The vertical signal lines 130 may be intersected with the transversal signal lines 120 and the common electrode line 160. Therefore, the arrangement of the insulating layer I1 may separate the vertical signal lines 130 from the common electrode line 160 and also separate the vertical signal lines 130 from the transversal signal lines 120. In some embodiments, a material of the insulating layer I1 may include an inorganic insulating material or an organic insulating material, where the inorganic insulating material includes silicon oxide, silicon nitride, or silicon oxynitride, etc., and the organic insulating material includes polymethyl methacrylate (PMMA), polyvinyl alcohol (PVA), polyvinyl phenol (PVP) or polyimide (PI), etc. In addition, a material of the vertical signal lines 130 includes a material with good conductivity, such as metal or alloy.

After the vertical signal lines 130 are fabricated, one or more insulating layers or functional layers may be selectively formed on the substrate 110, and in the embodiment, an insulating layer I2, a filter layer CF, and an insulating layer I3 are used as an example for description, but the disclosure is not limited thereto. Materials of the insulating layers I2 and I3 may include inorganic insulating materials or organic insulating materials, where the inorganic insulating materials include silicon oxide, silicon nitride, or silicon oxynitride, etc., and the organic insulating materials include polymethyl methacrylate (PMMA), polyvinyl alcohol (PVA), polyvinyl phenol (PVP) or polyimide (PI), etc. A material of the filter layer CF may include a color filter material, such as a red filter material, a green filter material, and a blue filter material. In addition, the insulating layer I3 may have a relatively thick thickness to serve as a planarization layer, but the disclosure is not limited thereto.

The pixel electrode 144 may be formed on the insulating layer I3. A material of the pixel electrode 144 may include a transparent conductive material. The transparent conductive material may include metal oxides, such as indium tin oxide, indium zinc oxide, aluminum tin oxide, aluminum zinc oxide, indium germanium zinc oxide, or other suitable oxides, or a stacked layer of at least two of the above materials. Alternatively, the transparent conductive material may be an organic transparent material. In some embodiments, a material of the pixel electrode 144 may be the same as the material of the first shielding vertical line 150A.

Figure 4:
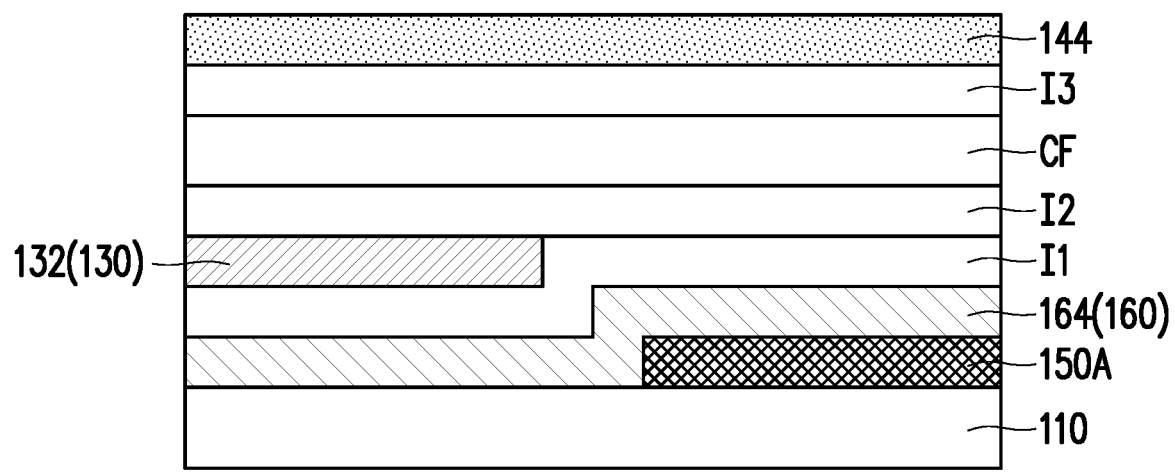
FIG. 4 is a schematic cross-sectional view of the electronic device of FIG. 2 along the section line A-A according to another embodiment of the disclosure.

FIG. 4 is a schematic cross-sectional view of the electronic device of FIG. 2 along the section line A-A according to another embodiment of the disclosure. In FIG. 4, the first shielding vertical line 150A, the common electrode line 160, the insulating layer I1, the vertical signal lines 130, the insulating layer I2, the filter layer CF, the insulating layer I3, and the pixel electrode 144 are sequentially stacked on the substrate 110. To be specific, a difference between the cross section of FIG. 4 and the cross section of FIG. 3 lies in a stacking order of the first shielding vertical line 150A and the common electrode line 160. Therefore, the related description of FIG. 3 may be referred for the materials and stacking relationship of each film layer in the cross section of FIG. 4.

Figure 5:
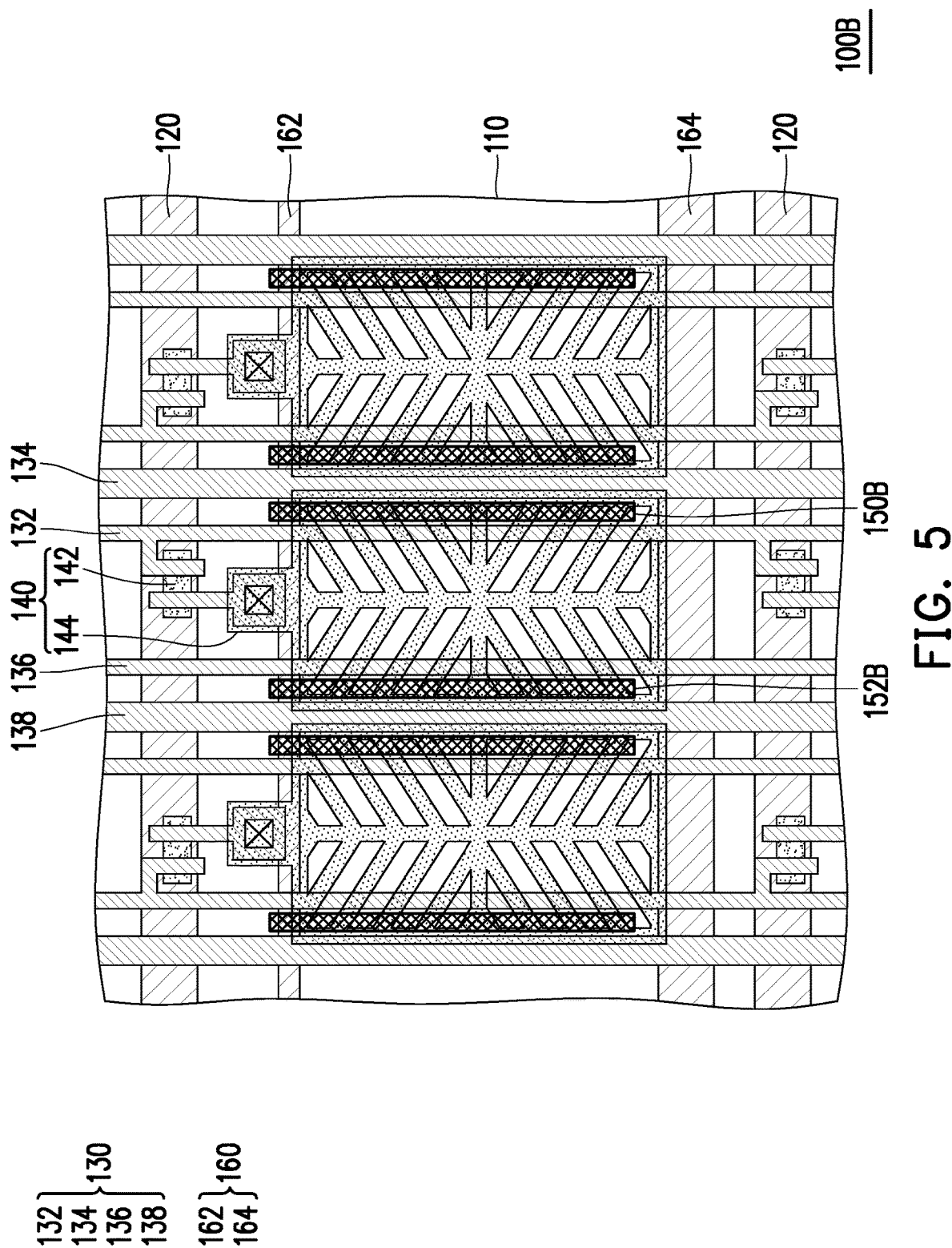

FIG. 5 is a partial schematic view of an electronic device according to an embodiment of the disclosure. An electronic device 100B of FIG. 5 is substantially similar to the electronic device 100A of FIG. 2, so that the aforementioned content may be referred for the same components described in the two embodiments. The electronic device 100B may include the substrate 110, a plurality of the transversal signal lines 120, a plurality of the vertical signal lines 130, the common electrode line 160, a first shielding vertical line 150B, and a second shielding vertical line 152B. The vertical signal lines 130 may include the first vertical signal line 132, the second vertical signal line 134, the third vertical signal line 136, and the fourth vertical signal line 138. The embodiment of FIG. 2 may be referred for the relative relationship of the substrate 110, the transversal signal lines 120, the first vertical signal line 132, the second vertical signal line 134, the third vertical signal line 136, the fourth vertical signal line 138, the pixel structures 140, the first shielding vertical line 150B and the common electrode line 160, and detail thereof is not repeated. To be specific, a difference between the present embodiment and the embodiment of FIG. 2 is that the electronic device 100B further includes the second shielding vertical line 152B, and a length design of the first shielding vertical line 150B is different.

In the embodiment, the first shielding vertical line 150B is located between the first vertical signal line 132 and the second vertical signal line 134, and the second shielding vertical line 152B is located between the third vertical signal line 136 and the fourth vertical signal line 138. In other words, the first vertical signal line 132 is located between the first shielding vertical line 150B and the second shielding vertical line 152B, and the third vertical signal line 136 is located between the first vertical signal line 132 and the second shielding vertical line 152B. The pixel structure 140 includes the active device 142 and the pixel electrode 144, and the second shielding vertical line 152B and the first shielding vertical line 150B are located on two opposite sides of the pixel electrode 144. In addition, the pixel electrode 144 may traverse the first shielding vertical line 150B and the second shielding vertical line 152B and extend to the second vertical signal line 134 and the fourth vertical signal line 138. In some embodiments, the first shielding vertical line 150B and the second shielding vertical line 152B are, for example, distributed symmetrically by the pixel structure 140. Namely, a distance between the first shielding vertical line 150B and a central axis of the pixel electrode 144 may be substantially the same as a distance between the second shielding vertical line 152B and the central axis of the pixel electrode 144, but the disclosure is not limited thereto.

In the embodiment, the first shielding vertical line 150B and the second shielding vertical line 152B may both traverse the first line 162 of the common electrode line 160, but are not intersected with the second line 164 of the common electrode line 160. In some embodiments, the first shielding vertical line 150B and the second shielding vertical line 152B may be separated from the second line 164 by a distance. However, in other embodiments, the first shielding vertical line 150B and the second shielding vertical line 152B may both traverse the first line 162 and are also overlapped with the second line 164. Alternatively, in other embodiments, the first shielding vertical line 150B and the second shielding vertical line 152B may be both overlapped with the second line 164, but both separated from the first line 162 by a distance. In overall, as long as the first shielding vertical line 150B and the second shielding vertical line 152B may contact one or both of the first line 162 and the second line 164, they may receive a common potential to provide a shielding effect. In addition, the second shielding vertical line 152B may be a transparent conductive pattern, so that the pixel structure 140 may also provide effective display in an area of the second shielding vertical line 152B without reducing an effective display area of the pixel structure 140 due to the arrangement of the second shielding vertical line 152B.

Figure 6:
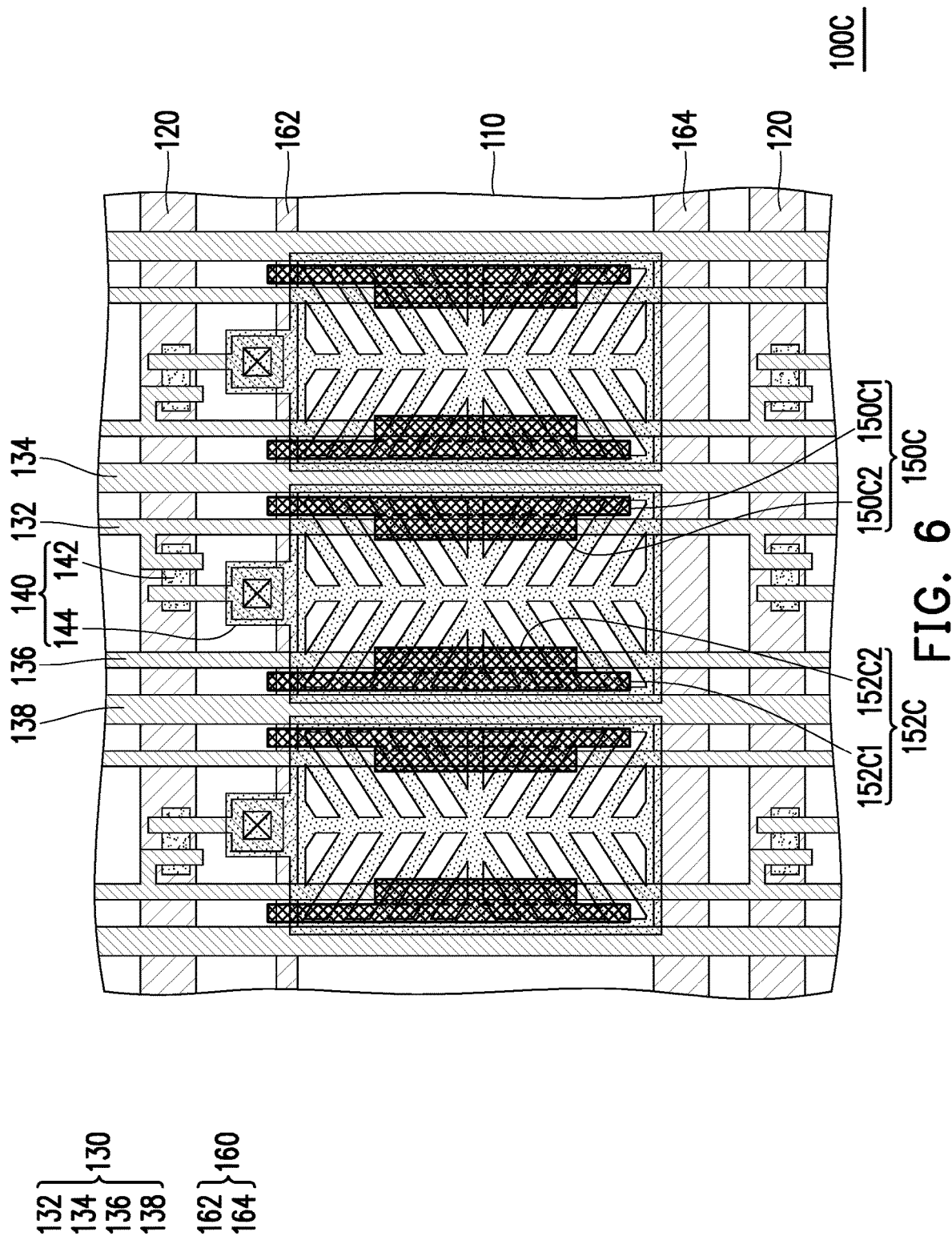

FIG. 6 is a partial schematic view of an electronic device according to an embodiment of the disclosure. An electronic device 100C of FIG. 6 is substantially similar to the electronic device 100B of FIG. 5, so that the aforementioned content may be referred for the same components described in the two embodiments. The electronic device 100C may include the substrate 110, a plurality of the transversal signal lines 120, a plurality of the vertical signal lines 130, the common electrode line 160, a first shielding vertical line 150C, and a second shielding vertical line 152C. The vertical signal lines 130 may include the first vertical signal line 132, the second vertical signal line 134, the third vertical signal line 136, and the fourth vertical signal line 138. The aforementioned embodiments may be referred for the relative relationship of the substrate 110, the transversal signal lines 120, the first vertical signal line 132, the second vertical signal line 134, the third vertical signal line 136, the fourth vertical signal line 138, the pixel structures 140, the first shielding vertical line 150C, the second shielding vertical line 152C and the common electrode line 160, and detail thereof is not repeated. To be specific, a difference between the present embodiment and the embodiment of FIG. 5 lies in different width designs of the first shielding vertical line 150C and the second shielding vertical line 152C in the electronic device 100C.

In the embodiment, the first shielding vertical line 150C has an extending portion 150C1 and an overlapping portion 150C2. The extending portion 150C1 extends in a gap between the first vertical signal line 132 and the second vertical signal line 134 and contacts the first line 162 of the common electrode line 160. The overlapping portion 150C2 is connected to the extending portion 150C1 and overlapped with the first vertical signal line 132. Moreover, the second shielding vertical line 152C also has an extending portion 152C1 and an overlapping portion 152C2. The extending portion 152C1 extends in a gap between the third vertical signal line 136 and the fourth vertical signal line 138 and contacts the first line 162 of the common electrode line 160. The overlapping portion 152C2 is connected to the extending portion 152C1 and overlapped with the third vertical signal line 136. In the embodiment, the overlapping portion 150C2 is connected to a middle section of the extending portion 150C1, and the overlapping portion 152C2 is connected to a middle section of the extending portion 152C1, but the disclosure is not limited thereto.

Figure 7:
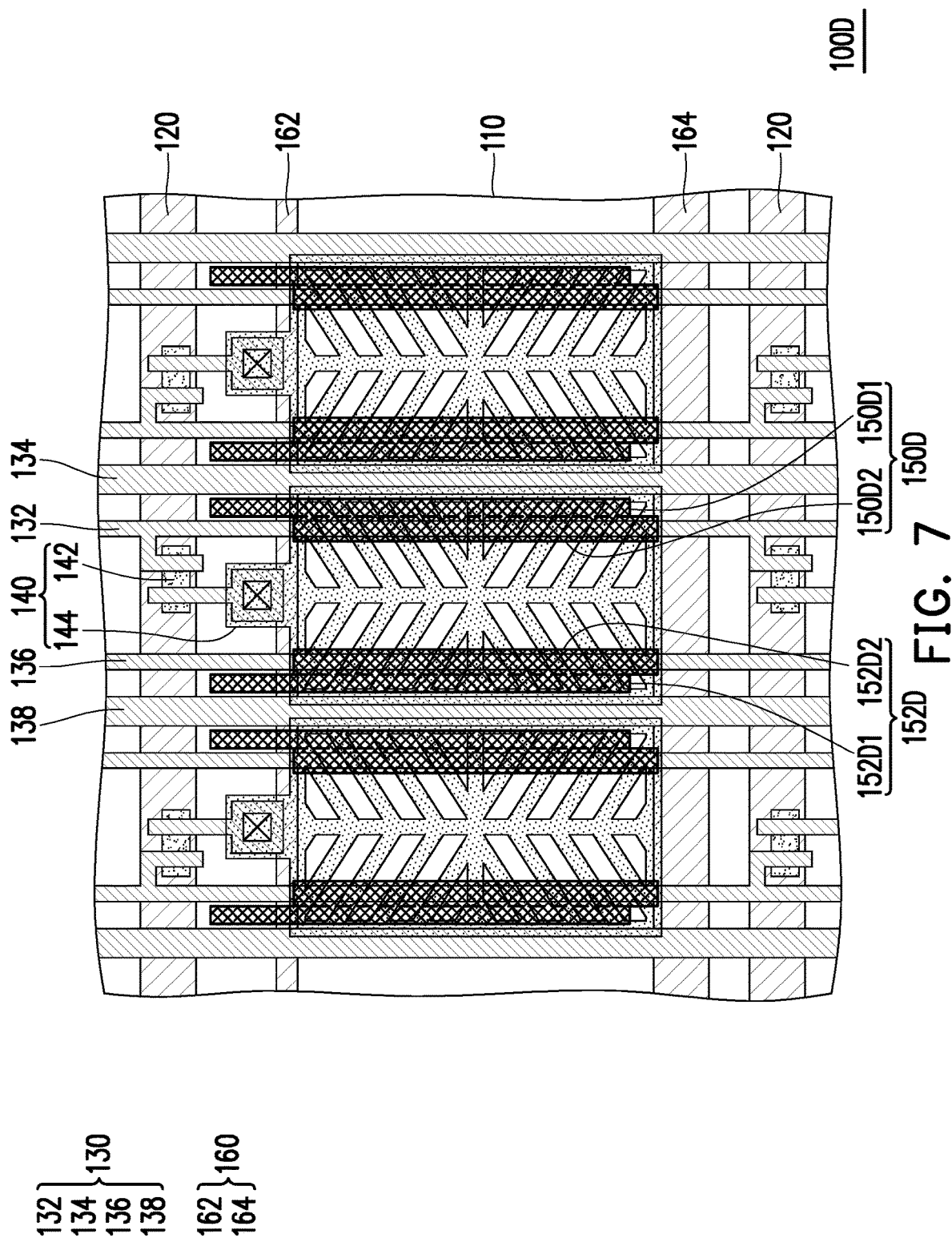

FIG. 7 is a partial schematic view of an electronic device according to an embodiment of the disclosure. An electronic device 100D of FIG. 7 is substantially similar to the electronic device 100C of FIG. 6, so that the aforementioned content may be referred for the same components described in the two embodiments. The electronic device 100D may include the substrate 110, a plurality of the transversal signal lines 120, a plurality of the vertical signal lines 130, the common electrode line 160, a first shielding vertical line 150D, and a second shielding vertical line 152D. The vertical signal lines 130 may include the first vertical signal line 132, the second vertical signal line 134, the third vertical signal line 136, and the fourth vertical signal line 138. The aforementioned embodiments may be referred for the relative relationship of the substrate 110, the transversal signal lines 120, the first vertical signal line 132, the second vertical signal line 134, the third vertical signal line 136, the fourth vertical signal line 138, the pixel structures 140, and the common electrode line 160, and detail thereof is not repeated. To be specific, a difference between the present embodiment and the embodiment of FIG. 6 lies in different designs of overlapping portions of the first shielding vertical line 150D and the second shielding vertical line 152D in the electronic device 100D.

To be specific, the first shielding vertical line 150D has an extending portion 150D1 and an overlapping portion 150D2. The extending portion 150D1 extends in a gap between the first vertical signal line 132 and the second vertical signal line 134 and contacts the first line 162 of the common electrode line 160. The overlapping portion 150D2 is connected to the extending portion 150D1 and overlapped with the first vertical signal line 132. Moreover, the overlapping portion 150D2 of the first shielding vertical line 150D may extend toward the second line 164 of the common electrode line 160 to overlap the second line 164. The second shielding vertical line 152D also has an extending portion 152D1 and an overlapping portion 152D2. The extending portion 152D1 extends in a gap between the third vertical signal line 136 and the fourth vertical signal line 138 and contacts the first line 162 of the common electrode line 160. The overlapping portion 152D2 is connected to the extending portion 152D1 and overlapped with the third vertical signal line 136. Moreover, the overlapping portion 152D2 of the second shielding vertical line 152D may extend toward the second line 164 of the common electrode line 160 to overlap the second line 164.

Figure 8:
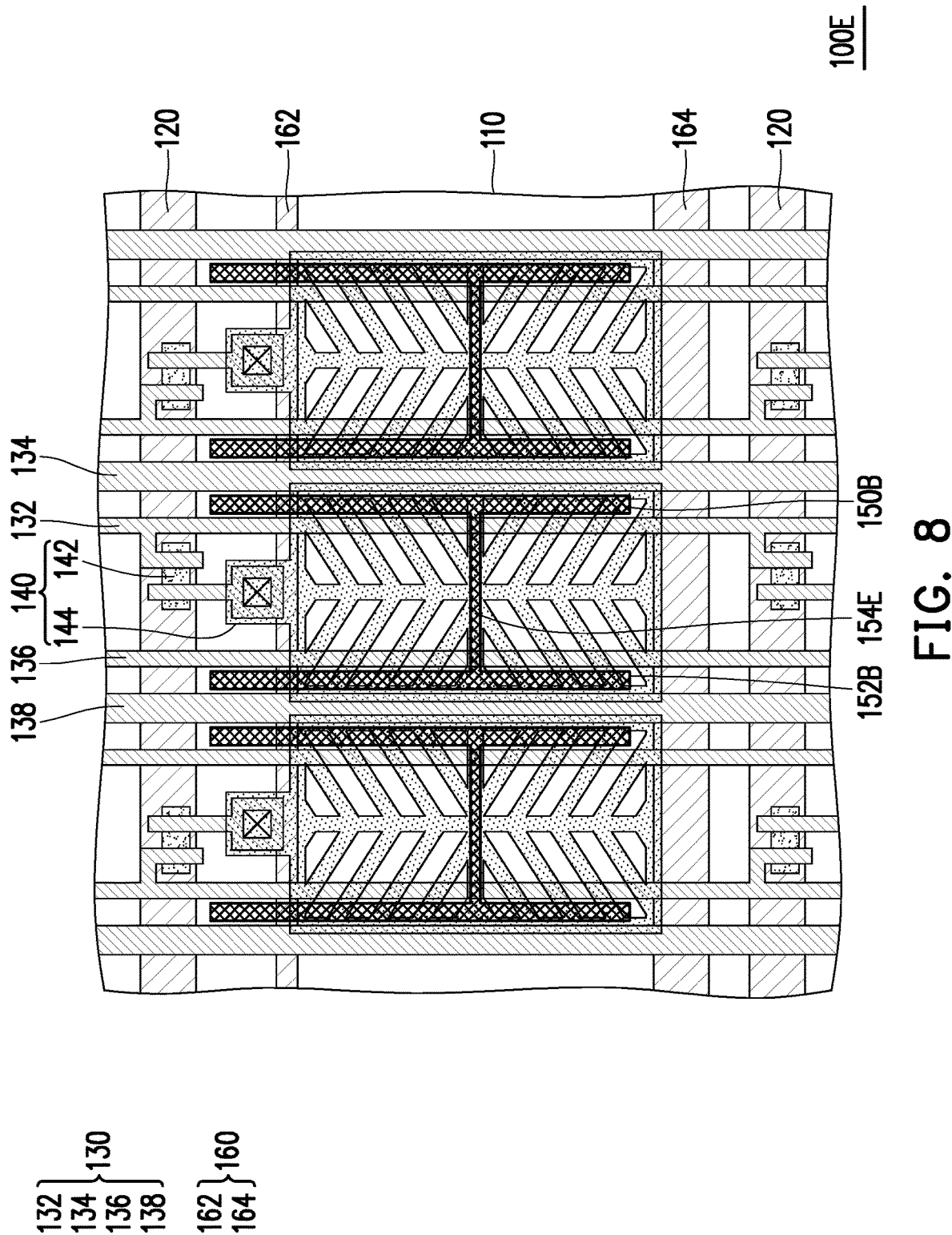

FIG. 8 is a partial schematic view of an electronic device according to an embodiment of the disclosure. An electronic device 100E of FIG. 8 is substantially similar to the electronic device 100B of FIG. 5, so that the aforementioned content may be referred for the same components described in the two embodiments. The electronic device 100E may include the substrate 110, a plurality of the transversal signal lines 120, a plurality of the vertical signal lines 130, the common electrode line 160, the first shielding vertical line 150B, the second shielding vertical line 152B, and a shielding transversal line 154E. The vertical signal lines 130 may include the first vertical signal line 132, the second vertical signal line 134, the third vertical signal line 136, and the fourth vertical signal line 138. The embodiment of FIG. 5 may be referred for the relative relationship of the substrate 110, the transversal signal lines 120, the first vertical signal line 132, the second vertical signal line 134, the third vertical signal line 136, the fourth vertical signal line 138, the pixel structures 140, the first shielding vertical line 150B and the common electrode line 160, and the arrangement method of the first shielding vertical line 150B and the second shielding vertical line 152B, and details thereof are not repeated. To be specific, a difference between the present embodiment and the embodiment of FIG. 5 is that the electronic device 100E further includes the shielding transversal line 154E.

The shielding transversal line 154E extends transversally from the first shielding vertical line 150B across the first vertical signal line 132 and the third vertical signal line 136 and is connected to the second shielding vertical line 152B. The shielding transversal line 154E is connected to a middle section of the first shielding vertical line 150B and is connected to a middle section of the second shielding vertical line 152B, so that the shielding transversal line 154E, the first shielding vertical line 150B and the second shielding vertical line 152B constitute an H-shaped pattern. In the embodiment, the pixel electrode 144 of the pixel structure 140, for example, has a horizontal trunk portion MH, and an orthogonal projection of the shielding transversal line 154E on the substrate 110 may be overlapped with an orthogonal projection of the horizontal trunk portion MH on the substrate 110, but the disclosure is not limited thereto. Moreover, the shielding transversal line 154E may be a transparent conductive pattern, so that the pixel structure 140 may also provide effective display in an area of the shielding transversal line 154E without reducing the effective display area of the pixel structure 140 due to the arrangement of the shielding transversal line 154E.

In some embodiments, since the shielding transversal line 154E connects the first shielding vertical line 150B and the second shielding vertical line 152B, only one of the first shielding vertical line 150B and the second shielding vertical line 152B may be connected to the common electrode line 160. For example, only one of the first shielding vertical line 150B and the second shielding vertical line 152B may be connected to the first line 162 of the common electrode line 160, connected to the second line 164 of the common electrode line 160, or connected to both the first line 162 and the second line 164 of the common electrode line 160.

Figure 9:
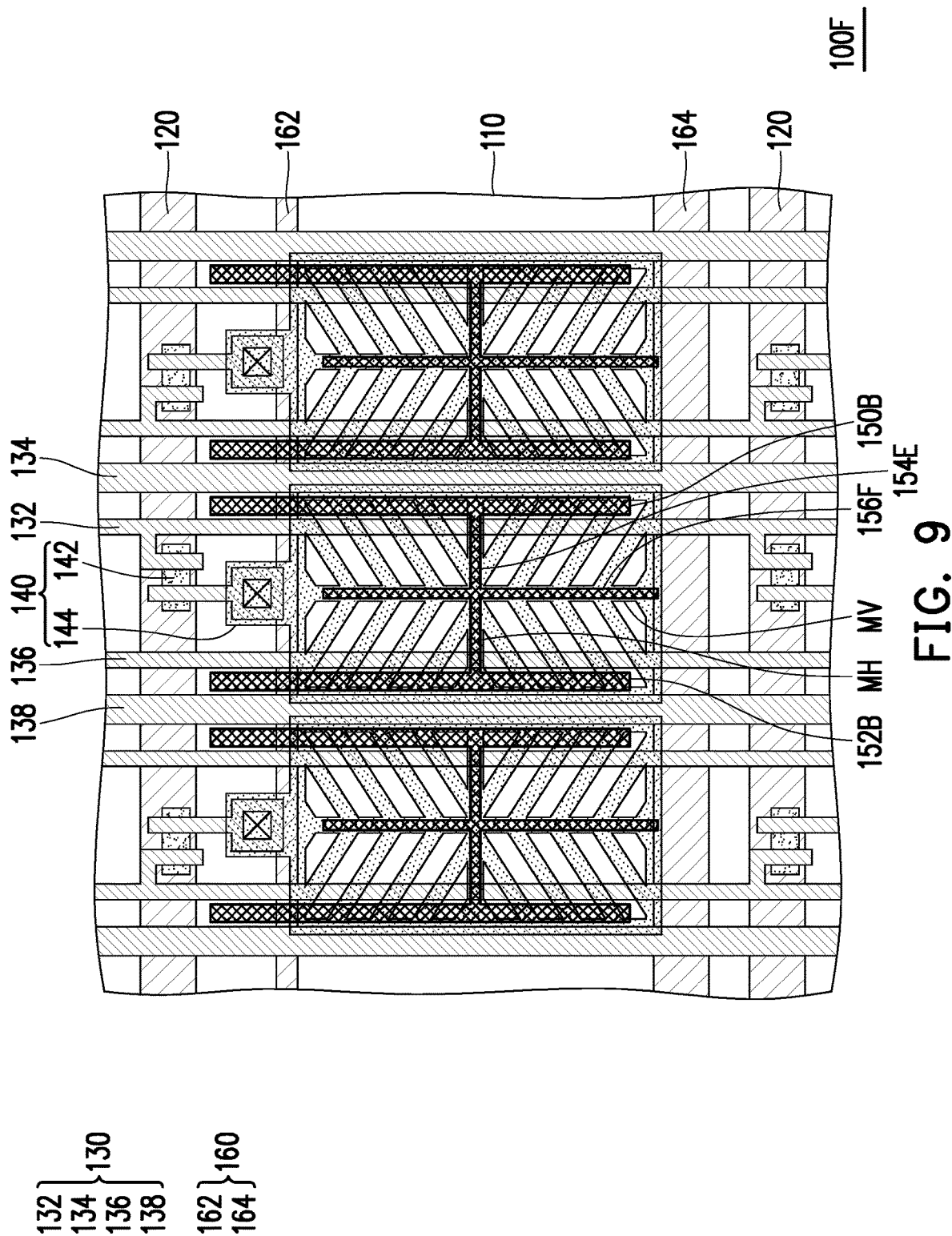

FIG. 9 is a partial schematic view of an electronic device according to an embodiment of the disclosure. An electronic device 100F of FIG. 9 is substantially similar to the electronic device 100E of FIG. 8, so that the aforementioned content may be referred for the same components described in the two embodiments. The electronic device 100F may include the substrate 110, a plurality of the transversal signal lines 120, a plurality of the vertical signal lines 130, the common electrode line 160, the first shielding vertical line 150B, the second shielding vertical line 152B, the shielding transversal line 154E, and a third shielding vertical line 156F. The vertical signal lines 130 may include the first vertical signal line 132, the second vertical signal line 134, the third vertical signal line 136, and the fourth vertical signal line 138. The embodiment of FIG. 2 may be referred for the relative relationship of the substrate 110, the transversal signal lines 120, the first vertical signal line 132, the second vertical signal line 134, the third vertical signal line 136, the fourth vertical signal line 138, the pixel structures 140, and the common electrode line 160, and the embodiment of FIG. 5 may be referred for the arrangement method of the first shielding vertical line 150B and the second shielding vertical line 152B, and the embodiment of FIG. 8 may be referred for the arrangement method of the shielding transversal line 154E, so that details thereof are not repeated.

To be specific, a difference between the present embodiment and the embodiment of FIG. 5 is that the electronic device 100F further includes the third shielding vertical line 156F. The third shielding vertical line 156F is located between the first shielding vertical line 150B and the second shielding vertical line 152B. The third shielding vertical line 156F may be connected to the shielding transversal line 154E, and the third shielding vertical line 156F may be intersected with the shielding transversal line 154E to form a cross shape, but the disclosure is not limited thereto. In the embodiment, the pixel electrode 144 of the pixel structure 140, for example, has the vertical trunk portion MV and the horizontal trunk portion MH, where an orthogonal projection of the third shielding vertical line 156F on the substrate 110 may be overlapped with the orthogonal projection of the vertical trunk portion MV on the substrate 110, and the orthogonal projection of the shielding transversal line 154E on the substrate 110 may be overlapped with the orthogonal projection of the horizontal trunk portion MH on the substrate 110, but the disclosure is not limited thereto. In addition, the shielding transversal lines 154E and the third shielding vertical line 156F may be transparent conductive patterns, so that the pixel structure 140 may also provide effective display in an area of the shielding transversal line 154E without reducing the effective display area of the pixel structure 140 due to the arrangement of the shielding transversal line 154E and the third shielding vertical line 156F.

Figure 10:
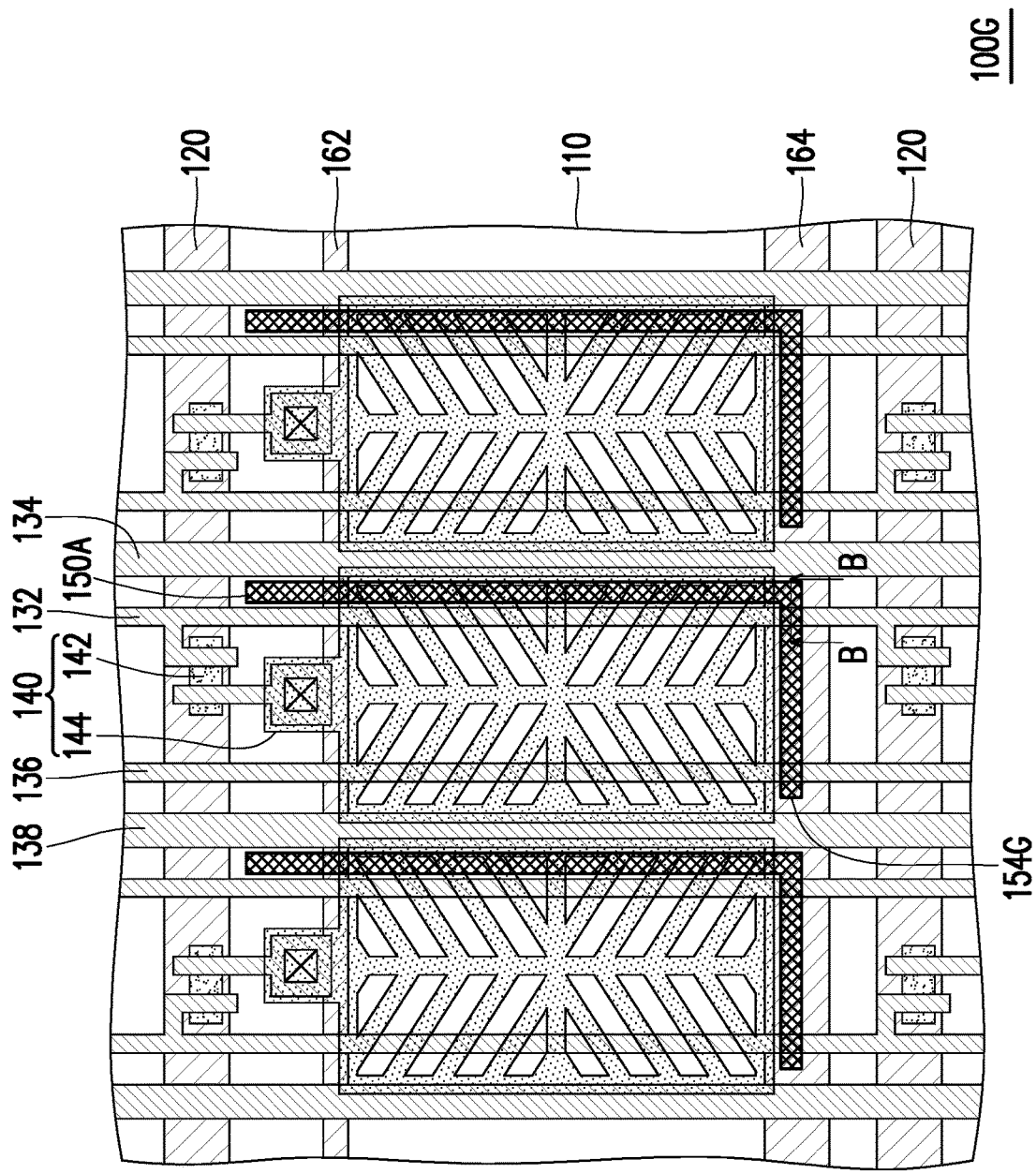

FIG. 10 is a partial schematic view of an electronic device according to an embodiment of the disclosure. An electronic device 100G of FIG. 10 is substantially similar to the electronic device 100A of FIG. 2, so that the aforementioned content may be referred for the same components described in the two embodiments. The electronic device 100G may include the substrate 110, a plurality of the transversal signal lines 120, a plurality of the vertical signal lines 130, the common electrode line 160, the first shielding vertical line 150A, and a shielding transversal line 154G. The vertical signal lines 130 may include the first vertical signal line 132, the second vertical signal line 134, the third vertical signal line 136, and the fourth vertical signal line 138. The embodiment of FIG. 2 may be referred for the relative relationship of the substrate 110, the transversal signal lines 120, the first vertical signal line 132, the second vertical signal line 134, the third vertical signal line 136, the fourth vertical signal line 138, the pixel structures 140, the first shielding vertical line 150A and the common electrode line 160, and details thereof are not repeated.

To be specific, a difference between the present embodiment and the embodiment of FIG. 2 is that the electronic device 100G further includes the shielding transversal line 154G. The shielding transversal line 154G extends transversally from the first shielding vertical line 150A across the first vertical signal line 132 and the shielding transversal line 154G is connected to an end of the first shielding vertical line 150A. An orthogonal projection of the shielding transversal line 154G on the substrate 110 may be overlapped with an orthogonal projection of the second line 164 of the common electrode line 160 on the substrate 110, and may be completely positioned within the orthogonal projection of the second line 164 of the common electrode line 160 on the substrate 110.

FIG. 11 is a schematic cross-sectional view of the electronic device of FIG. 2 along a section line B-B according to another embodiment of the disclosure. In FIG. 11, the common electrode line 160, the shielding transversal line 154G, the insulating layer I1, the vertical signal lines 130, the insulating layer I2, the filter layer CF, the insulating layer I3, and the pixel electrode 144 are sequentially stacked on the substrate 110, where the shielding transversal line 154G and the first shielding vertical line 150A are of the same film layer. The related descriptions of FIG. 3 and FIG. 4 may be referred for the material of each film layer of the embodiment, and details thereof are not repeated. Moreover, in the cross section of FIG. 11, a section SEC1 represents a stacking order of each of the film layers when the shielding transversal line 154G is overlapped with both the vertical signal lines 130 and the common electrode line 160. Meanwhile, a section SEC2 represents a stacking order of each of the film layers when the first shielding vertical line 150A and the shielding transversal line 154G are overlapped with the common electrode line 160, where a number of the film layers in the section SEC2 and the stacking order of the film layers are substantially the same as the cross-sectional structure of FIG. 3. In the section SEC1, the shielding transversal line 154G and the first vertical signal line 132 are overlapped in a thickness direction. However, the insulating layer I1 is disposed between the shielding transversal line 154G and the first vertical signal line 132. Therefore, the shielding transversal line 154G and the first vertical signal line 132 will not be short circuited with each other.

FIG. 12 is a schematic cross-sectional view of the electronic device of FIG. 2 along the section line B-B according to another embodiment of the disclosure. In FIG. 12, the shielding transversal line 154G, the common electrode line 160, the insulating layer I1, the vertical signal lines 130, the insulating layer I2, the filter layer CF, the insulating layer I3, and the pixel electrode 144 are sequentially stacked on the substrate 110. To be specific, a difference between the cross section of FIG. 12 and the cross section of FIG. 11 lies in a stacking order of the shielding transversal line 154G and the common electrode line 160. Therefore, related description of FIG. 11 may be referred for the materials and a stacking relationship of the film layers in the cross section of FIG. 12, and details thereof are not repeated. In the cross section of FIG. 12, the section SEC1 represents a stacking order of each of the film layers when the shielding transversal lines 154G is overlapped with both the vertical signal lines 130 and the common electrode line 160. Meanwhile, the section SEC2 represents a stacking order of each of the film layers when the first shielding vertical line 150A and the shielding transversal line 154G are overlapped with the common electrode line 160, where a number of the film layers in the section SEC2 and the stacking order of the film layers are substantially the same as the cross-sectional structure of FIG. 4.

In the section SEC1 of FIG. 11 and FIG. 12, the overlapping relationship between the shielding transversal line 154G and the vertical signal lines 130 and the stacking order of the film layers may be applied to any of the embodiments of FIG. 6 to FIG. 9. For example, after the common electrode line 160 in the section SEC1 is removed, it may be regarded as a cross-sectional structure where the overlapping portions 150C2 and 150D2 are overlapped with the first vertical signal line 132 in the embodiments of FIG. 6 and FIG. 7. For example, the cross-sectional structure where the overlapping portions 150C2 and 150D2 are overlapped with the first vertical signal line 132 may include the sequentially stacked substrate 110, the overlapping portion 150C2 or 150D2, the insulating layer I1, the first vertical signal line 132, the insulating layer I2, the filter layer CF, the insulating layer I3 and the pixel electrode 144. The cross-sectional structure where the overlapping portions 152C2 and 152D2 are overlapped with the third vertical signal line 136 in the embodiments of FIG. 6 and FIG. 7, and the cross-sectional structure where the shielding transversal line 154E is overlapped with the first vertical signal line 132 and the third vertical signal line 136 in the embodiments of FIG. 8 and FIG. 9, for example, the cross-sectional structure where the overlapping portions 150C2 and 150D2 are overlapped with the third vertical signal line 136 may include the sequentially stacked substrate 110, the overlapping portion 150C2 or 150D2, the insulating layer I1, the third vertical signal line 136, the insulating layer I2, the filter layer CF, the insulating layer I3 and the pixel electrode 144.

Figure 13:
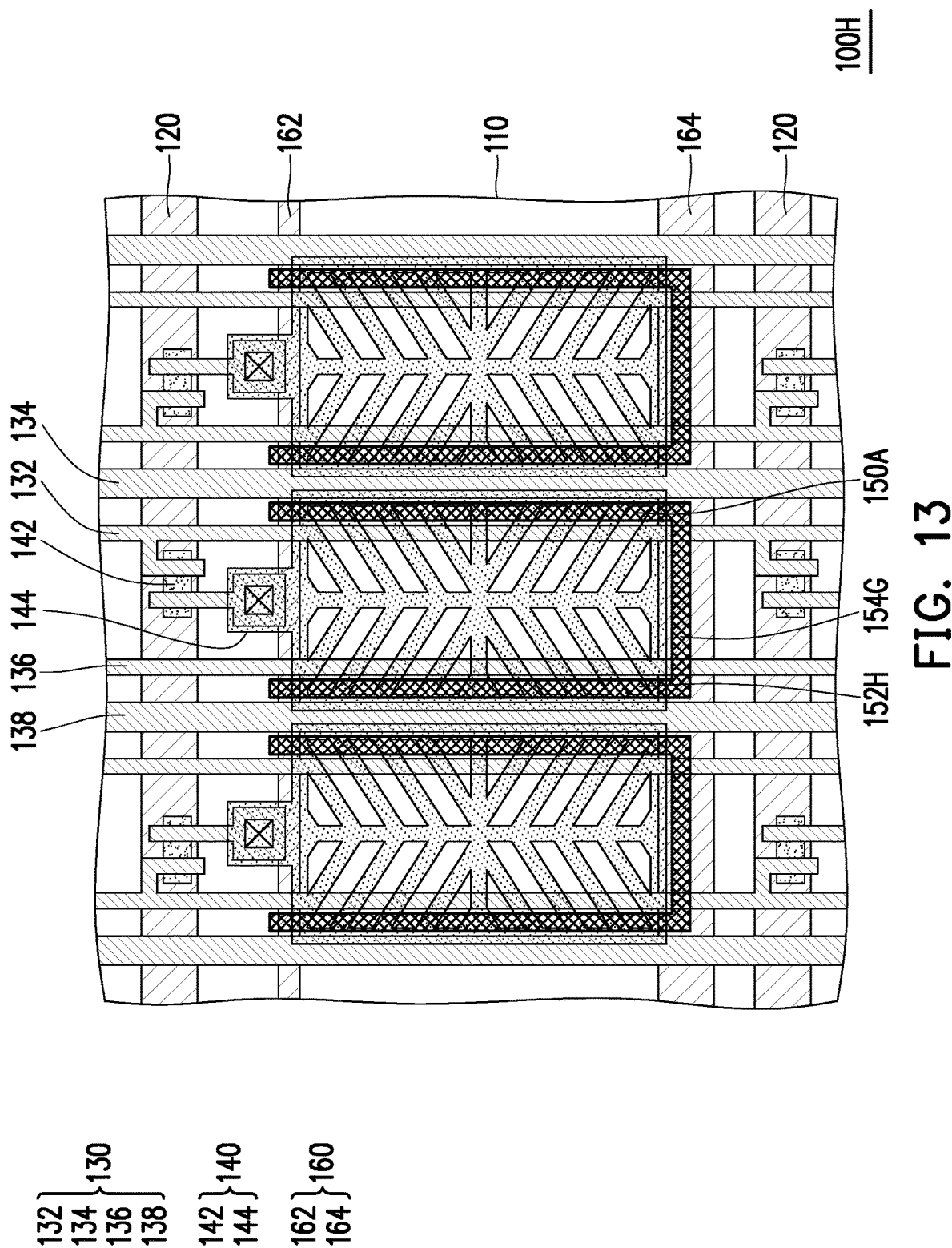

FIG. 13 is a partial schematic view of an electronic device according to an embodiment of the disclosure. An electronic device 100H of FIG. 13 is substantially similar to the electronic device 100G of FIG. 10, so that the aforementioned content may be referred for the same components described in the two embodiments. The electronic device 100H may include the substrate 110, a plurality of the transversal signal lines 120, a plurality of the vertical signal lines 130, the common electrode line 160, the first shielding vertical line 150A, the shielding transversal line 154G, and a second shielding vertical line 152H. The vertical signal lines 130 may include the first vertical signal line 132, the second vertical signal line 134, the third vertical signal line 136, and the fourth vertical signal line 138. The aforementioned embodiments may be referred for the relative relationship of the substrate 110, the transversal signal lines 120, the first vertical signal line 132, the second vertical signal line 134, the third vertical signal line 136, the fourth vertical signal line 138, the pixel structures 140, the first shielding vertical line 150A and the common electrode line 160, and details thereof are not repeated. To be specific, a difference between the present embodiment and the embodiment of FIG. 10 is that the electronic device 100H further includes the second shielding vertical line 152H.

In the embodiment, the first shielding vertical line 150A is located between the first vertical signal line 132 and the second vertical signal line 134, and the second shielding vertical line 152H is located between the third vertical signal line 136 and the fourth vertical signal line 138. The shielding transversal line 154G is connected between an end of the first shielding vertical line 150A and an end of the second shielding vertical line 152H to form a U-shaped pattern, but the disclosure is not limited thereto. The pixel structure 140 includes the active element 142 and the pixel electrode 144, and the first shielding vertical line 150A and the second shielding vertical line 152H are located on two opposite sides of the pixel electrode 144. The pixel electrode 144 may traverse the first shielding vertical line 150A and the second shielding vertical line 152H. The first shielding vertical line 150A and the second shielding vertical line 152H are all made of transparent conductive materials, so that the regions where the first shielding vertical line 150A and the second shielding vertical line 152H are located do not shield a display area of the pixel structure 140, such that a display effect of the electronic device 100H is ensured.

In the embodiment, the U-shaped pattern formed by connecting the shielding transversal line 154G, the first shielding vertical line 150A, and the second shielding vertical line 152H with each other is, for example, overlapped with the first line 162 of the common electrode line 160 as well the second line 164 of the common electrode line 160, and the first shielding vertical line 150A and the second shielding vertical line 152H even traverse the first line 162, but the disclosure is not limited thereto. In some embodiments, only one or two of the shielding transversal line 154G, the first shielding vertical line 150A, and the second shielding vertical line 152H may be overlapped with and in contact with the common electrode line 160. For example, the first shielding vertical line 150A and the second shielding vertical line 152H may have different lengths, such that one of the first shielding vertical line 150A and the second shielding vertical line 152H traverses the first line 162, and the other one is separated from the first line 162 by a distance. Alternatively, in other embodiments, the shielding transversal line 154G connected between the first shielding vertical line 150A and the second shielding vertical line 152H may not be overlapped with the second line 164.

Figure 14:
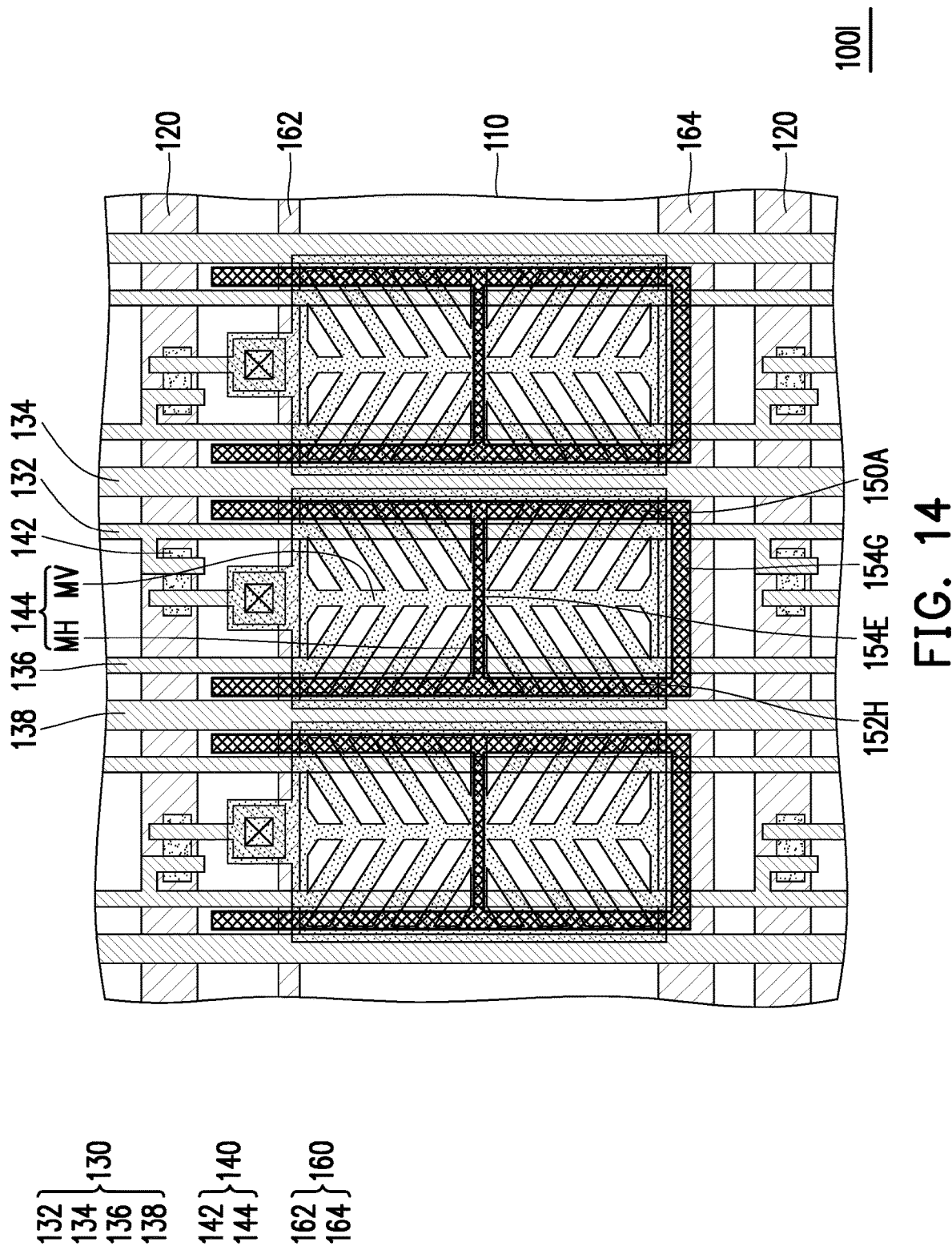

FIG. 14 is a partial schematic view of an electronic device according to an embodiment of the disclosure. An electronic device 100I of FIG. 14 is substantially similar to the electronic device 100H of FIG. 13, so that the aforementioned content may be referred for the same components described in the two embodiments. The electronic device 100I may include the substrate 110, a plurality of the transversal signal lines 120, a plurality of the vertical signal lines 130, the common electrode line 160, the first shielding vertical line 150A, the shielding transversal line 154G, the second shielding vertical line 152H, and the shielding transversal line 154E. The vertical signal lines 130 may include the first vertical signal line 132, the second vertical signal line 134, the third vertical signal line 136, and the fourth vertical signal line 138. The aforementioned embodiments may be referred for the relative relationship of the substrate 110, the transversal signal lines 120, the first vertical signal line 132, the second vertical signal line 134, the third vertical signal line 136, the fourth vertical signal line 138, the pixel structures 140, the first shielding vertical line 150A and the common electrode line 160, and details thereof are not repeated.

To be specific, a difference between the present embodiment and the embodiment of FIG. 13 is that the electronic device 100I further includes the shielding transversal line 154E, where the arrangement of the shielding transversal line 154E is substantially the same as the shielding transversal line 154E in FIG. 8. The shielding transversal line 154E extends transversally from the first shielding vertical line 150A across the first vertical signal line 132 and the third vertical signal line 136 and is connected to the second shielding vertical line 152H. The shielding transversal line 154E is connected to a middle section of the first shielding vertical line 150A and is connected to a middle section of the second shielding vertical line 152H. The pixel electrode 144 of the pixel structure 140, for example, has the horizontal trunk portion MH and the vertical trunk portion MV, and the horizontal trunk portion MH and the vertical trunk portion MV are intersected in a cross shape, and an orthogonal projection of the shielding transversal line 154E on the substrate 110 may be overlapped with an orthogonal projection of the horizontal trunk portion MH on the substrate 110, but the disclosure is not limited thereto.

Figure 15:
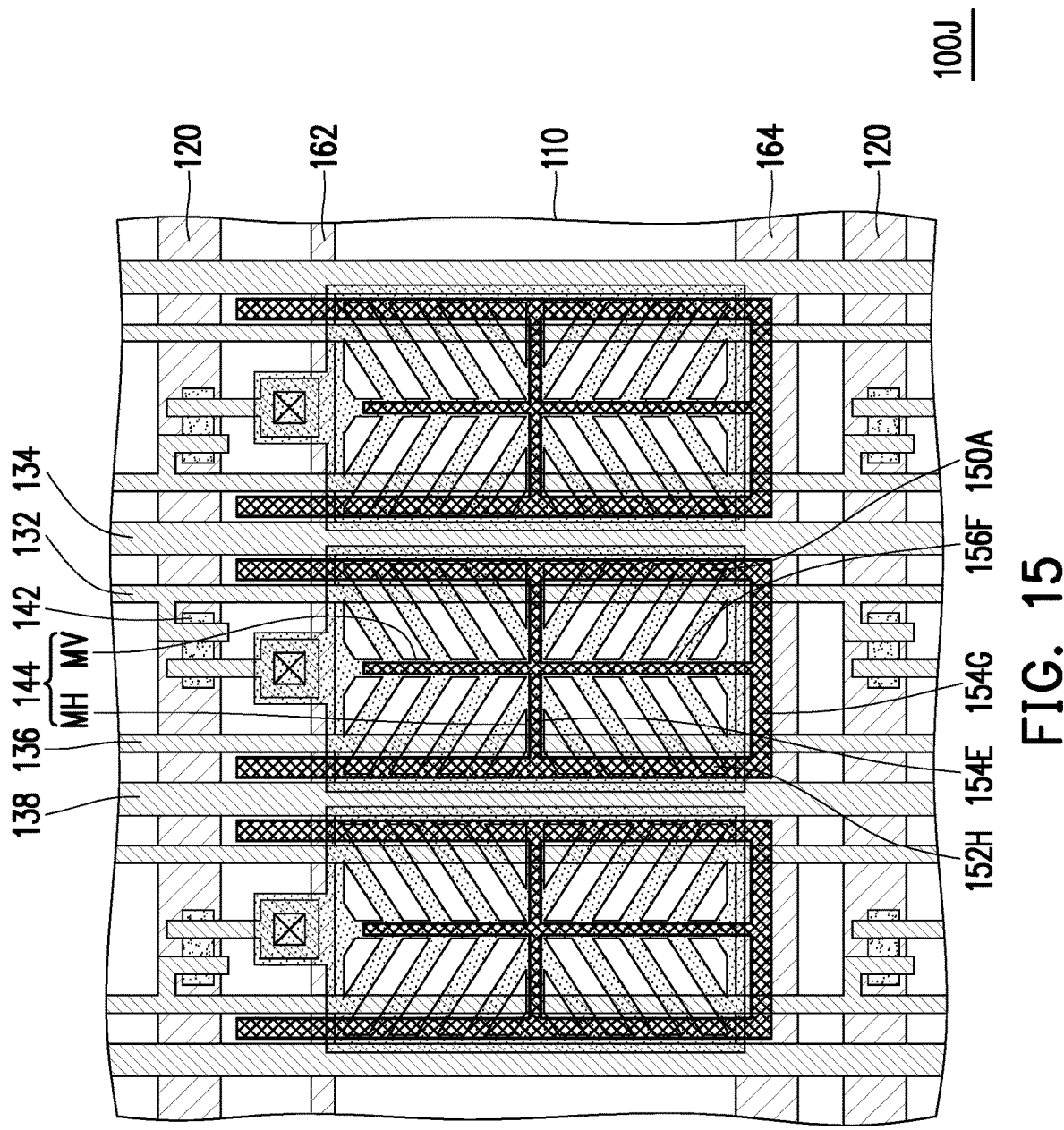

FIG. 15 is partial schematic view of an electronic device according to an embodiment of the disclosure. An electronic device 100J of FIG. 15 is substantially similar to the electronic device 100I of FIG. 14, so that the aforementioned content may be referred for the same components described in the two embodiments. The electronic device 100J may include the substrate 110, a plurality of the transversal signal lines 120, a plurality of the vertical signal lines 130, the common electrode line 160, the first shielding vertical line 150A, the shielding transversal line 154G, the second shielding vertical line 152H, the shielding transversal line 154E, and the third shielding vertical line 156F. The vertical signal lines 130 may include the first vertical signal line 132, the second vertical signal line 134, the third vertical signal line 136, and the fourth vertical signal line 138. The aforementioned embodiments may be referred for the relative relationship of the substrate 110, the transversal signal lines 120, the first vertical signal line 132, the second vertical signal line 134, the third vertical signal line 136, the fourth vertical signal line 138, the pixel structures 140, the first shielding vertical line 150A and the common electrode line 160, so that details thereof are not repeated.

To be specific, a difference between the present embodiment and the embodiment of FIG. 13 is that the electronic device 100J further includes the third shielding vertical line 156F, where the arrangement of the third shielding vertical line 156F is substantially the same as the third shielding vertical line 156F in FIG. 9. The third shielding vertical line 156F is located between the first shielding vertical line 150A and the second shielding vertical line 152H. The third shielding vertical line 156F may be connected to the shielding transversal line 154E, and the third shielding vertical line 156F may be intersected with the shielding transversal line 154E to form a cross shape, but the disclosure is not limited thereto. In the embodiment, the pixel electrode 144 of the pixel structure 140, for example, has the vertical trunk portion MV and the horizontal trunk portion MH, where an orthogonal projection of the third shielding vertical line 156F on the substrate 110 may be overlapped with the orthogonal projection of the vertical trunk portion MV on the substrate 110, and the orthogonal projection of the shielding transversal line 154E on the substrate 110 may be overlapped with the orthogonal projection of the horizontal trunk portion MH on the substrate 110, but the disclosure is not limited thereto.

Figure 16:
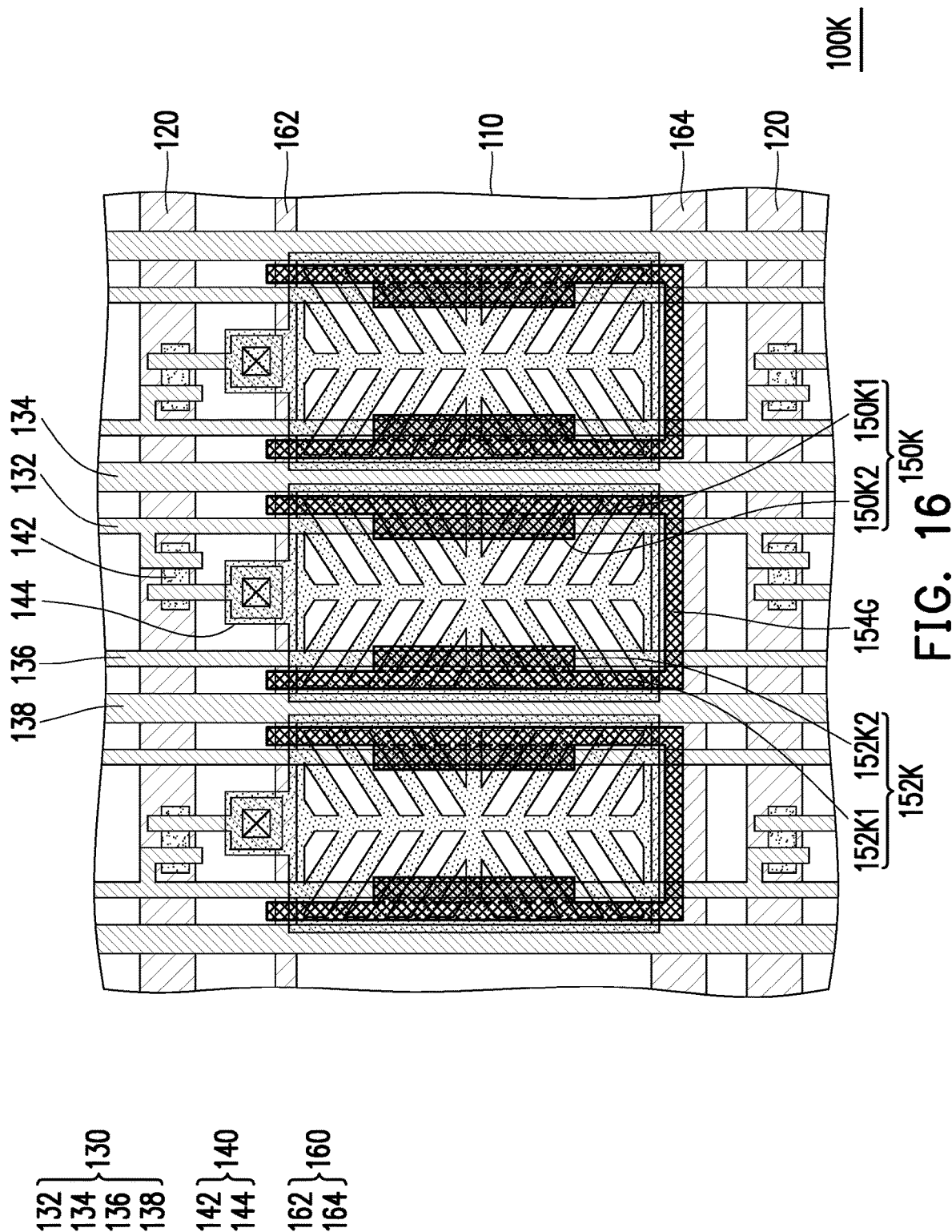

FIG. 16 is a partial schematic view of an electronic device according to an embodiment of the disclosure. An electronic device 100K of FIG. 16 is substantially similar to the electronic device 100H of FIG. 13, so that the aforementioned content may be referred for the same components described in the two embodiments. The electronic device 100K may include the substrate 110, a plurality of the transversal signal lines 120, a plurality of the vertical signal lines 130, the common electrode line 160, a first shielding vertical line 150K, the shielding transversal line 154G, and a second shielding vertical line 152K. The vertical signal lines 130 may include the first vertical signal line 132, the second vertical signal line 134, the third vertical signal line 136, and the fourth vertical signal line 138. The aforementioned embodiments may be referred for the relative relationship of the substrate 110, the transversal signal lines 120, the first vertical signal line 132, the second vertical signal line 134, the third vertical signal line 136, the fourth vertical signal line 138, the pixel structures 140, the first shielding vertical line 150A and the common electrode line 160, and details thereof are not repeated.

To be specific, a layout and a pattern design of the first shielding vertical line 150K and the second shielding vertical line 152K are substantially the same as those of the first shielding vertical line 150C and the second shielding vertical line 152C of FIG. 6. However, in the electronic device 100K, the first shielding vertical line 150K, and the second shielding vertical line 152K may extend to overlap the second line 164 of the common electrode line 160 and are connected by the shielding transversal line 154G at both ends of the first shielding vertical line 150K and the second shielding vertical line 152K.

The first shielding vertical line 150K has an extending portion 150K1 and an overlapping portion 150K2. The extending portion 150K1 extends in a gap between the first vertical signal line 132 and the second vertical signal line 134 and contacts the first line 162 and the second line 164 of the common electrode line 160. The overlapping portion 150K2 is connected to the extending portion 150K1 and overlapped with the first vertical signal line 132. Moreover, the second shielding vertical line 152K also has an extending portion 152K1 and an overlapping portion 152K2. The extending portion 152K1 extends in a gap between the third vertical signal line 136 and the fourth vertical signal line 138 and contacts the first line 162 of the common electrode line 160. The overlapping portion 152K2 is connected to the extending portion 152K1 and overlapped with the third vertical signal line 136. In the embodiment, the overlapping portion 150K2 is connected to a middle section of the extending portion 150K1, and the overlapping portion 152K2 is connected to a middle section of the extending portion 152K1, but the disclosure is not limited thereto.

Figure 17:
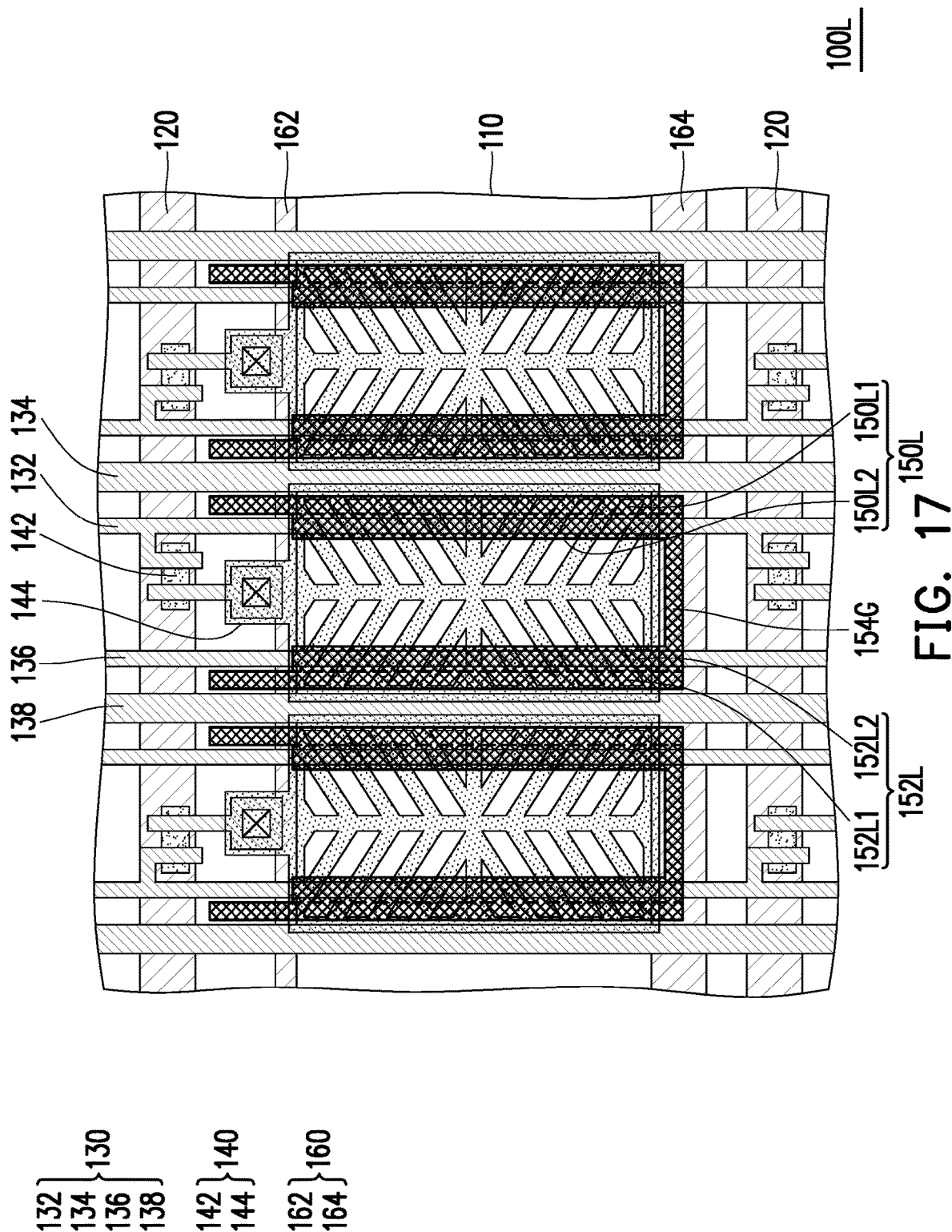

FIG. 17 is a partial schematic view of an electronic device according to an embodiment of the disclosure. An electronic device 100L of FIG. 17 is substantially similar to the electronic device 100H of FIG. 13, so that the aforementioned content may be referred for the same components described in the two embodiments. The electronic device 100L may include the substrate 110, a plurality of the transversal signal lines 120, a plurality of the vertical signal lines 130, the common electrode line 160, a first shielding vertical line 150L, the shielding transversal line 154G, and a second shielding vertical line 152L. The vertical signal lines 130 may include the first vertical signal line 132, the second vertical signal line 134, the third vertical signal line 136, and the fourth vertical signal line 138. The aforementioned embodiments may be referred for the relative relationship of the substrate 110, the transversal signal lines 120, the first vertical signal line 132, the second vertical signal line 134, the third vertical signal line 136, the fourth vertical signal line 138, the pixel structures 140, the first shielding vertical line 150A, and the common electrode line 160, and details thereof are not repeated.

In the embodiment, a layout and a pattern design of the first shielding vertical line 150L and the second shielding vertical line 152L are substantially the same as those of the first shielding vertical line 150D and the second shielding vertical line 152D of FIG. 7. The first shielding vertical line 150L may include an extending portion 150L1 located between the first vertical signal line 132 and the second vertical signal line 134 and an overlapping portion 150L2 overlapped with the first vertical signal line 132. The second shielding vertical line 152L may include an extending portion 152L1 located between the third vertical signal line 136 and the fourth vertical signal line 138 and an overlapping portion 152L2 overlapped with the third vertical signal line 136. Moreover, an end of the first shielding vertical line 150L and an end of the second shielding vertical line 152L are connected by the shielding transversal line 154G.

Figure 18:
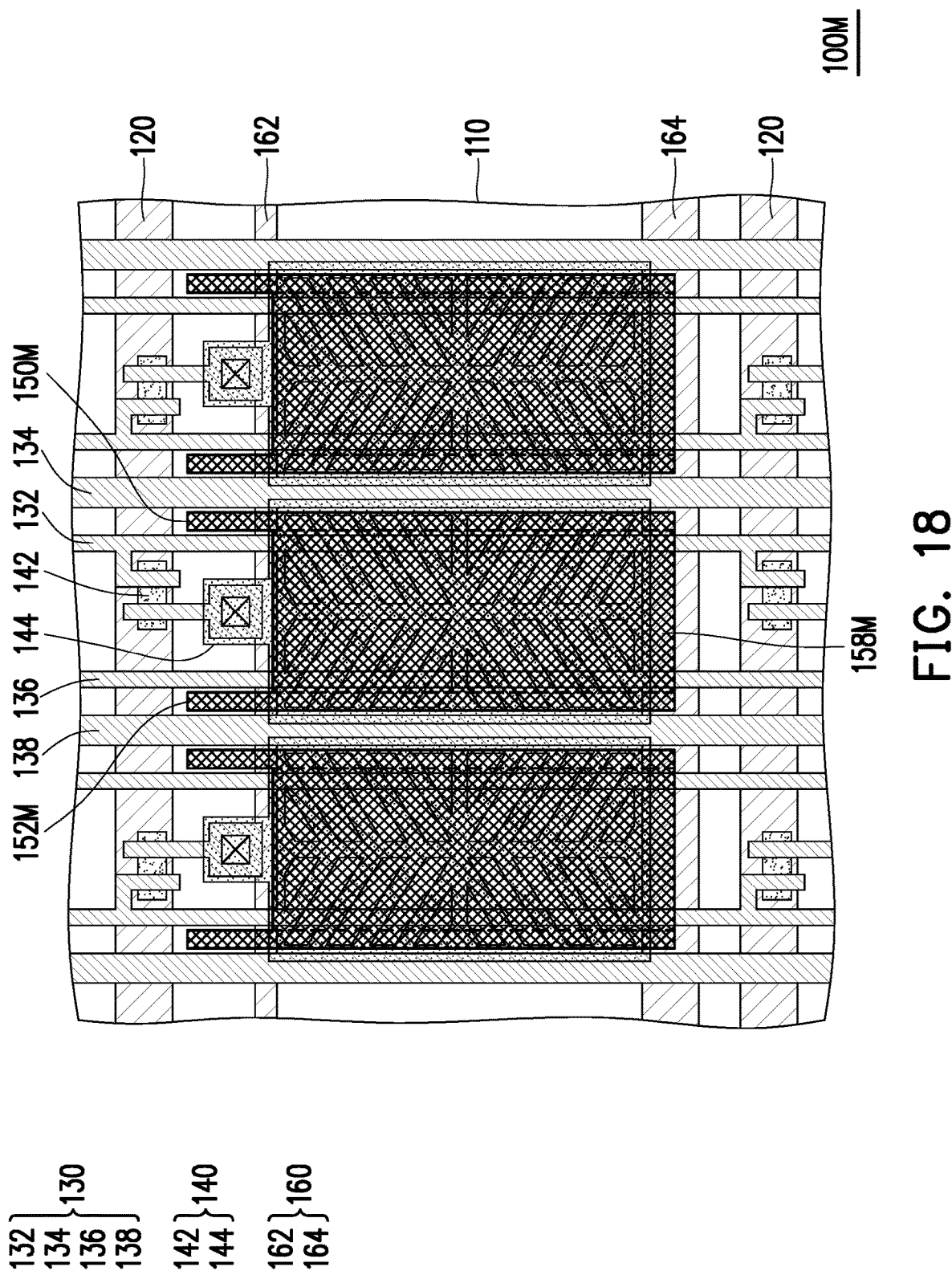

FIG. 18 is a partial schematic view of an electronic device according to an embodiment of the disclosure. An electronic device 100M of FIG. 18 includes the substrate 110, a plurality of the transversal signal lines 120, the first vertical signal line 132, the second vertical signal line 134, the third vertical signal line 136, the fourth vertical signal line 138, a plurality of pixel structures 140, a first shielding vertical line 150M, a second shielding vertical line 152M, a shielding electrode 158M, and the common electrode line 160 including the first line 162 and the second line 164. In the embodiment, the substrate 110, the transversal signal lines 120, the first vertical signal line 132, the second vertical signal line 134, the third vertical signal line 136, the fourth vertical signal line 138, the pixel structures 140, and the common electrode line 160 are substantially the same as that of the embodiment of FIG. 2, so that the related descriptions of FIG. 2 may be referred for detailed structures, materials and a relative configuration relationship of the aforementioned components, and details thereof are not repeated.

In FIG. 18, an orthogonal projection of the first shielding vertical line 150M on the substrate 110 is located between the orthogonal projection of the first vertical signal line 132 on the substrate 110 and the orthogonal projection of the second vertical signal line 134 on the substrate 110, and an orthogonal projection of the second shielding vertical line 152M on the substrate 110 is located between the orthogonal projection of the third vertical signal line 136 on the substrate 110 and the orthogonal projection of the fourth vertical signal line 138 on the substrate 110. Moreover, the first shielding vertical line 150M and the second shielding vertical line 152M are connected to the shielding electrode 158M, and the first shielding vertical line 150M and the second shielding vertical line 152M may extend toward the corresponding transversal signal line 120 to traverse the first line 162 of the common electrode line 160.

The shielding electrode 158M is, for example, an integral electrode, and traverses the first vertical signal line 132 and the third vertical signal line 134. The shielding electrode 158M is substantially located between the second vertical signal line 134 and the fourth vertical signal line 138 without overlapping the second vertical signal line 134 and the fourth vertical signal line 138. An orthogonal projection of the shielding electrode 158M on the substrate 110 is overlapped with an orthogonal projection of the pixel electrode 144 of the pixel structure 140 on the substrate 110. The shielding electrode 158M, the first shielding vertical line 150M and the second shielding vertical line 152M are connected as a whole, and are, for example, made of a transparent conductive material. Therefore, although the shielding electrode 158M is overlapped with most of the area of the pixel electrode 144, the shielding electrode 158M does not affect the effective display area of the pixel structure 140.

FIG. 19 is a partial schematic view of an electronic device according to an embodiment of the disclosure. An electronic device 100N of FIG. 19 includes the substrate 110, a plurality of the transversal signal lines 120, the first vertical signal line 132, the second vertical signal line 134, the third vertical signal line 136, the fourth vertical signal line 138, a plurality of the pixel structures 140 respectively including the active device 142 and the pixel electrode 144, a first shielding vertical line 150N, a second shielding vertical line 152N, and the common electrode line 160 including the first line 162 and the second line 164. In the embodiment, configuration methods, structures and a stacking order of the substrate 110, the transversal signal lines 120, the first vertical signal line 132, the second vertical signal line 134, the third vertical signal line 136, the fourth vertical signal line 138, the pixel structures 140, and the common electrode line 160 are substantially the same as that of the embodiment of FIG. 2, so that the descriptions of FIG. 2 may be referred for details of the above components.

In the embodiment, an orthogonal projection of the first shielding vertical line 150N on the substrate 110 is located between the orthogonal projection of the first vertical signal line 132 on the substrate 110 and the orthogonal projection of the second vertical signal line 134 on the substrate 110, and an orthogonal projection of the second shielding vertical line 152N on the substrate 110 is located between the orthogonal projection of the third vertical signal line 136 on the substrate 110 and the orthogonal projection of the fourth vertical signal line 138 on the substrate 110. Moreover, the first shielding vertical line 150N and the second shielding vertical line 152N all traverse and intersect the transversal signal lines 120 and the first line 162 and the second line 164 of the common electrode line 160.

The transversal signal lines 120 and the common electrode line 160 may be made of the same film layer, where the signals transmitted by the transversal signal lines 120 are scan signals provided to the active devices 142, and the signal transmitted by the common electrode line 160 is a common potential. The first shielding vertical line 150N and the second shielding vertical line 152N intersected with the transversal signal lines 120 and the common electrode line 160 must avoid electrical short circuit with the transversal signal lines 120 and the common electrode line 160. Therefore, the film layers of the first shielding vertical line 150N and the second shielding vertical line 152N may be different from the film layers of the transversal signal lines 120 and the common electrode line 160. Moreover, in the embodiment, the first shielding vertical line 150N and the second shielding vertical line 152N may be electrically connected to the common electrode line 160 through conducting structures TH to receive the common potential, but the disclosure is not limited thereto. In some embodiments, the conducting structures TH in the electronic device 100N may be omitted, and the first shielding vertical line 150N and the second shielding vertical line 152N may be extended to the driving circuit of the electronic device 100N (such as the driving circuit IC shown in FIG. 1), and the driving circuit directly provides the required potential to the first shielding vertical line 150N and the second shielding vertical line 152N.

FIG. 20 is a schematic cross-sectional view illustrating a structure of the electronic device of FIG. 19 along a section line C-C according to another embodiment of the disclosure, and FIG. 21 is a schematic cross-sectional view illustrating a structure of the electronic device of FIG. 19 along a section line D-D according to an embodiment of the disclosure. According to FIG. 19, FIG. 20, and FIG. 21, it is learned that the first shielding vertical line 150N, an insulating layer I0, the common electrode line 160, the insulating layer I1, the first vertical signal line 132, the insulating layer I2, the filter layer CF, the insulating layer I3, and the pixel electrode 144 are sequentially stacked on the substrate 110. The materials of the insulating layer I0, the insulating layer I1, the insulating layer I2, and the insulating layer I3 may include inorganic insulating materials or organic insulating materials, where the inorganic insulating materials include silicon oxide, silicon nitride, or silicon oxynitride, etc., and the organic insulating materials include polymethyl methacrylate (PMMA), polyvinyl alcohol (PVA), polyvinyl phenol (PVP) or polyimide (PI), etc. A material of the filter layer CF may include a color filter material, such as a red filter material, a green filter material, and a blue filter material. Materials of the common electrode line 160 and the first vertical signal line 132 include metal or alloy. Materials of the first shielding vertical line 150N and the pixel electrode 144 include a transparent conductive material. In addition, the film layer of the transversal signal lines 120 in FIG. 19 is the same as the film layer of the common electrode line 160, and a stacking method of the second shielding vertical line 152N in the cross-sectional structure in FIG. 19 may be the same as that of the first shielding vertical line 150N.

According to FIG. 20, it is learned that the conducting structure TH may electrically connect the first shielding vertical line 150N and the first line 162 of the common electrode line 160, and the conducting structure TH is a conductor structure penetrating the insulating layer I0. In this way, the film layer of the first shielding vertical line 150N is different from the film layer of the common electrode line 160 but the first shielding vertical line 150N may be electrically connected to the common electrode line 160. When the common electrode line 160 and the transversal signal lines 120 are of the same film layer, the first shielding vertical line 150N is not connected to the transversal signal lines 120, and the transversal signal lines 120 and the common electrode line 160 may maintain independent electrical properties.

FIG. 22 is a schematic cross-sectional view illustrating a structure of the electronic device of FIG. 19 along the section line C-C according to an embodiment of the disclosure, and FIG. 23 is a schematic cross-sectional view illustrating a structure of the electronic device of FIG. 19 along the section line D-D according to another embodiment of the disclosure. According to FIG. 19, FIG. 22, and FIG. 23, it is learned that the common electrode line 160, the insulating layer I1, the first shielding vertical line 150N, the insulating layer I2, the filter layer CF, the insulating layer I3, and the pixel electrode 144 are sequentially stacked on the substrate 110. The film layer of the transversal signal lines 120 in FIG. 19 is the same as the film layer of the common electrode line 160, and the stacking method of the second shielding vertical line 152N in the cross-sectional structure of FIG. 19 may be the same as that of the first shielding vertical line 150N. In the embodiment, the related descriptions of FIG. 20 and FIG. 21 may be referred for the material of each film layer.

According to FIG. 22, it is learned that the conducting structure TH may electrically connect the first shielding vertical line 150N and the first line 162 of the common electrode line 160, and the conducting structure TH is a conductor structure penetrating the insulating layer I1. In this way, the film layer of the first shielding vertical line 150N is different from the film layer of the common electrode line 160 but the first shielding vertical line 150N may be electrically connected to the common electrode line 160. When the common electrode line 160 and the transversal signal lines 120 are of the same film layer, the first shielding vertical line 150N is not connected to the transversal signal lines 120, and the transversal signal lines 120 and the common electrode line 160 may maintain independent electrical properties.

Moreover, in the embodiment, both the first vertical signal line 132 and the first shielding vertical line 150N are sandwiched between the insulating layer I1 and the insulating layer I2. However, the first vertical signal line 132 and the first shielding vertical line 150N may be made of different film layers. Therefore, the first vertical signal line 132 and the first shielding vertical line 150N may be components made of different materials. For example, the material of the first vertical signal line 132 may include metal, alloy, etc., and the material of the first shielding vertical line 150N may include transparent conductive materials such as metal oxides, organic conductive materials, etc.

FIG. 24 is a schematic cross-sectional view illustrating a structure of the electronic device of FIG. 19 along the section line C-C according to still another embodiment of the disclosure, and FIG. 25 is a schematic cross-sectional view illustrating a structure of the electronic device of FIG. 19 along the section line D-D according to still another embodiment of the disclosure. According to FIG. 19, FIG. 24, and FIG. 25, it is learned that the first line 162 and the second line 164 of the common electrode line 160, the insulating layer I1, the first vertical signal line 132, the insulating layer I2, the first shielding vertical line 150N, the filter layer CF, the insulating layer I3, and the pixel electrode 144 are sequentially stacked on the substrate 110. The film layer of the transversal signal lines 120 in FIG. 19 is the same as the film layer of the common electrode line 160, and the stacking method of the second shielding vertical line 152N in the cross-sectional structure of FIG. 19 may be the same as that of the first shielding vertical line 150N. In the embodiment, the related descriptions of FIG. 20 and FIG. 21 may be referred for the material of each film layer. In the embodiment, the film layer of the first shielding vertical line 150N is disposed above the insulating layer I2, and the film layer of the common electrode line 160 is disposed below the insulating layer I1. Therefore, the conducting structure TH used for electrically connecting the first shielding vertical line 150N to the common electrode line 160 may penetrate the insulating layer I1 and the insulating layer I2.

FIG. 20, FIG. 22, and FIG. 24 respectively show implementations of the first shielding vertical line 150N in different stacking orders, but the disclosure is not limited thereto. In addition, the conducting structures TH may be omitted in some embodiments, and the first shielding vertical line 150N and the second shielding vertical line 152N may be extended to the driving circuit disposed at periphery of the electronic device 100N to receive the required signals.

FIG. 26 is a schematic top view of an electronic device according to an embodiment of the disclosure. An electronic device 100O of FIG. 26 includes the substrate 110, a plurality of the transversal signal lines 120, the first vertical signal line 132, the second vertical signal line 134, the third vertical signal line 136, the fourth vertical signal line 138, a plurality of the pixel structures 140 respectively including the active device 142 and the pixel electrode 144, a first shielding vertical line 150O, a second shielding vertical line 152O, and the common electrode line 160 including the first line 162 and the second line 164. In the embodiment, configuration methods, structures and a stacking order of the substrate 110, the transversal signal lines 120, the first vertical signal line 132, the second vertical signal line 134, the third vertical signal line 136, the fourth vertical signal line 138, the pixel structures 140, and the common electrode line 160 are substantially the same as that of the embodiment of FIG. 19, so that the descriptions of FIG. 19 may be referred for details of the above components.

In the embodiment, an orthogonal projection of the first shielding vertical line 150O on the substrate 110 is located between the orthogonal projection of the first vertical signal line 132 on the substrate 110 and the orthogonal projection of the second vertical signal line 134 on the substrate 110, and an orthogonal projection of the second shielding vertical line 152O on the substrate 110 is located between the orthogonal projection of the third vertical signal line 136 on the substrate 110 and the orthogonal projection of the fourth vertical signal line 138 on the substrate 110. The first shielding vertical line 150O and the second shielding vertical line 152O are not overlapped with the transversal signal lines 120, and not overlapped with the second line 164 of the common electrode line 160.

Moreover, the film layer of the first shielding vertical line 150O and the second shielding vertical line 152O may be different from the film layer of the common electrode line 160. The first shielding vertical line 150O and the second shielding vertical line 152O may be connected to the first line 162 of the common electrode line 160 through the conducting structures, so as to receive the common potential. To be specific, the description of FIG. 20 to FIG. 24 may be referred for the stacking method of the first shielding vertical line 150O and the second shielding vertical line 152O in the cross-sectional structure. In other words, the cross-sectional structures of FIG. 20 to FIG. 24 may also be used as implementations of the electronic device 100O.

FIG. 27 is a schematic top view of an electronic device according to an embodiment of the disclosure. An electronic device 100P of FIG. 27 includes the substrate 110, a plurality of the transversal signal lines 120, the first vertical signal line 132, the second vertical signal line 134, the third vertical signal line 136, the fourth vertical signal line 138, a plurality of the pixel structures 140 respectively including the active device 142 and the pixel electrode 144, a first shielding vertical line 150P, a second shielding vertical line 152P, a shielding transversal line 154P, and the common electrode line 160 including the first line 162 and the second line 164. In the embodiment, configuration methods, structures and a stacking order of the substrate 110, the transversal signal lines 120, the first vertical signal line 132, the second vertical signal line 134, the third vertical signal line 136, the fourth vertical signal line 138, the pixel structures 140, and the common electrode line 160 are substantially the same as that of the embodiment of FIG. 2, so that the descriptions of FIG. 2 may be referred for details of the above components.

In the embodiment, an orthogonal projection of the first shielding vertical line 150P on the substrate 110 is located between the orthogonal projection of the first vertical signal line 132 on the substrate 110 and the orthogonal projection of the second vertical signal line 134 on the substrate 110, and an orthogonal projection of the second shielding vertical line 152P on the substrate 110 is located between the orthogonal projection of the third vertical signal line 136 on the substrate 110 and the orthogonal projection of the fourth vertical signal line 138 on the substrate 110. The shielding transversal line 154P extends transversally from the first shielding vertical line 150P across the first vertical signal line 132 and the third vertical signal line 136, and the shielding transversal line 154P is connected between the first shielding vertical line 150P and the second shielding vertical line 152P. Moreover, an orthogonal projection of the shielding transversal line 154P on the substrate 110 may be overlapped with an orthogonal projection of the second line 164 of the common electrode line 160 on the substrate 110.

FIG. 28 is a schematic cross-sectional view illustrating a structure of the electronic device of FIG. 27 along a section line E-E according to an embodiment of the disclosure. According to FIG. 27 and FIG. 28, it is learned that the first shielding vertical line 150P, the shielding transversal line 154P, the insulating layer I0, the common electrode line 160, the insulating layer I1, the first vertical signal line 132, the insulating layer I2, the filter layer CF, the insulating layer I3, and the pixel electrode 144 are sequentially stacked on the substrate 110. The materials of the insulating layer I0, the insulating layer I1, the insulating layer I2, and the insulating layer I3 may include inorganic insulating materials or organic insulating materials, where the inorganic insulating materials include silicon oxide, silicon nitride, or silicon oxynitride, etc., and the organic insulating materials include polymethyl methacrylate (PMMA), polyvinyl alcohol (PVA), polyvinyl phenol (PVP) or polyimide (PI), etc. A material of the filter layer CF may include a color filter material, such as a red filter material, a green filter material, and a blue filter material. Materials of the common electrode line 160 and the first vertical signal line 132 include metal or alloy. Materials of the first shielding vertical line 150P, the shielding transversal line 154P and the pixel electrode 144 include a transparent conductive material. In addition, the film layer of the transversal signal lines 120 in FIG. 27 is the same as the film layer of the common electrode line 160, and a stacking method of the second shielding vertical line 152P in the cross-sectional structure in FIG. 27 may be the same as that of the first shielding vertical line 150P. Moreover, according to FIG. 28, it is learned that the shielding transversal line 154P and the first vertical signal line 132 are overlapped in a thickness direction D3.

FIG. 29 is a schematic cross-sectional view illustrating a structure of the electronic device of FIG. 27 along a section line E-E according to an embodiment of the disclosure. According to FIG. 27 and FIG. 29, it is learned that the common electrode line 160, the insulating layer I1, the first vertical signal line 132, the insulating layer I2, the first shielding vertical line 150P, the shielding transversal line 154P, the filter layer CF, the insulating layer I3, and the pixel electrode 144 are sequentially stacked on the substrate 110. The materials of the insulating layer I1, the insulating layer I2, and the insulating layer I3 may include inorganic insulating materials or organic insulating materials, where the inorganic insulating materials include silicon oxide, silicon nitride, or silicon oxynitride, etc., and the organic insulating materials include polymethyl methacrylate (PMMA), polyvinyl alcohol (PVA), polyvinyl phenol (PVP) or polyimide (PI), etc. A material of the filter layer CF may include a color filter material, such as a red filter material, a green filter material, and a blue filter material. Materials of the common electrode line 160 and the first vertical signal line 132 include metal or alloy. Materials of the first shielding vertical line 150P, the shielding transversal line 154P and the pixel electrode 144 include a transparent conductive material. In addition, the film layer of the transversal signal lines 120 in FIG. 27 is the same as the film layer of the common electrode line 160, and a stacking method of the second shielding vertical line 152P in the cross-sectional structure in FIG. 27 may be the same as that of the first shielding vertical line 150P. In the embodiment, the shielding transversal line 154P is overlapped with the first vertical signal line 132 in the thickness direction D3, and at least the insulating layer I2 is configured between the film layer of the shielding transversal line 154P and the film layer of the first vertical signal line 132. In this way, although the shielding transversal line 154P is intersected with the first vertical signal line 132, the two lines are not electrically connected to each other.

FIG. 30 is a partial schematic top view of an electronic device according to an embodiment of the disclosure. An electronic device 100Q of FIG. 30 includes the substrate 110, a plurality of the transversal signal lines 120, the first vertical signal line 132, the second vertical signal line 134, the third vertical signal line 136, the fourth vertical signal line 138, a plurality of the pixel structures 140 respectively including the active device 142 and the pixel electrode 144, a first shielding vertical line 150Q, a second shielding vertical line 152Q, the shielding transversal line 154G, and the common electrode line 160 including the first line 162 and the second line 164. In the embodiment, configuration methods, structures and a stacking order of the substrate 110, the transversal signal lines 120, the first vertical signal line 132, the second vertical signal line 134, the third vertical signal line 136, the fourth vertical signal line 138, the pixel structures 140, and the common electrode line 160 are substantially the same as that of the embodiment of FIG. 27, so that the descriptions of FIG. 27 may be referred for details of the above components.

In the embodiment, the first shielding vertical line 150Q is located between the first vertical signal line 132 and the second vertical signal line 134, and the second shielding vertical line 152Q is located between the third vertical signal line 136 and the fourth vertical signal line 138. The first shielding vertical line 150Q and the second shielding vertical line 152Q may be electrically connected to the first line 162 of the common electrode line 160 through the conducting structures TH, respectively. The first shielding vertical line 150Q and the second shielding vertical line 152Q are not overlapped with the transversal signal lines 120, and the shielding transversal line 154G is connected between an end of the first shielding vertical line 150Q and an end of the second shielding vertical line 152Q to form a U-shaped pattern, but the disclosure is not limited thereto. Moreover, the transversal shielding line 154G may be overlapped with the second line 164 of the common electrode line 160. The cross-sectional structures of the first shielding vertical line 150Q, the second shielding vertical line 152Q and the shielding transversal line 154G may be the same as that of the first shielding vertical line 150P, the second shielding vertical line 152P and the shielding transversal line 154P in FIG. 28 and FIG. 29.

FIG. 31 is a partial schematic top view of an electronic device according to an embodiment of the disclosure. FIG. 31 illustrates a substrate 210, a first vertical signal line 232, a second vertical signal line 234, a third vertical signal line 236, a pixel electrode 244 of a pixel structure 240, a first shielding vertical line 250A, and a second shielding vertical line 252A of an electronic device 200A. To be specific, the electronic device 200A may be composed of the structures of FIG. 31 arranged in an array, and the electronic device 200A may also include lines and circuit structures such as transversal signal lines, active devices of the pixel structures 240, etc., but in order to clearly describe the configuration of the vertical lines, an omitted block BK is used in FIG. 31 to indicate a location of the above components. In some embodiments, the description of the embodiment of FIG. 2, etc., may be referred for the configuration of the transversal signal lines and the active devices, but the disclosure is not limited thereto.

In the embodiment, the pixel electrode 244 may include a first sub-electrode 244A and a second sub-electrode 244B, and the first sub-electrode 244A and the second sub-electrode 244B are respectively located on two opposite sides of the omitted block BK. The first vertical signal line 232 and the third vertical signal line 234 are located at periphery of the pixel electrode 244. The second vertical signal line 234 is substantially overlapped with a central trunk portion MV of the first sub-electrode 244A of the pixel electrode 244. To be specific, an orthogonal projection of the second vertical signal line 234 on the substrate 210 is substantially overlapped with a center line of an orthogonal projection of the first sub-electrode 244A on the substrate 110 and also overlapped with a center line of an orthogonal projection of the second sub-electrode 244B on the substrate 110. The first shielding vertical line 250A and the second shielding vertical line 252A are respectively located on two opposite sides of the pixel electrode 244. Meanwhile, an orthogonal projection of the first shielding vertical line 250A on the substrate 210 is located between an orthogonal projection of the first vertical signal line 232 on the substrate 210 and the orthogonal projection of the second vertical signal line 234 on the substrate 210, and an orthogonal projection of the second shielding vertical line 252A on the substrate 210 is located between an orthogonal projection of the third vertical signal line 236 on the substrate 210 and the orthogonal projection of the second vertical signal line 234 on the substrate 210.

FIG. 32 is a schematic cross-sectional view illustrating a structure of the first shielding vertical line 250A in the electronic device 200A of FIG. 31 according to an embodiment of the disclosure. According to FIG. 32, it is learned that the first shielding vertical line 250A, the insulating layer I1, the insulating layer I2, and the pixel electrode 244 may be sequentially stacked on the substrate 210. The materials of the insulating layer I1 and the insulating layer I2 may include inorganic insulating materials or organic insulating materials, where the inorganic insulating materials include silicon oxide, silicon nitride, or silicon oxynitride, etc., and the organic insulating materials include polymethyl methacrylate (PMMA), polyvinyl alcohol (PVA), polyvinyl phenol (PVP) or polyimide (PI), etc. Materials of the first shielding vertical line 250A and the pixel electrode 244 include a transparent conductive material. In addition, the film layer of the first vertical signal line 232, the second vertical signal line 234 and the third vertical signal line 236 in FIG. 31 may be disposed between the insulating layer I1 and the insulating layer I2, and a stacking method of the second shielding vertical line 252A in the cross-sectional structure of FIG. 31 may be the same as that of the first shielding vertical line 250A.

FIG. 33 is a schematic cross-sectional view illustrating a structure of the first shielding vertical line 250A in the electronic device 200A of FIG. 31 according to another embodiment of the disclosure. According to FIG. 33, it is learned that the first shielding vertical line 250A, the insulating layer I1, the insulating layer I2, and the pixel electrode 244 may be sequentially stacked on the substrate 210, and the filter layer CF and the third insulating layer I3 may be further disposed between the insulating layer I2 and the pixel electrode 244. In the embodiment, the materials of the insulating layer I1, the insulating layer I2 and the insulating layer I3 may include inorganic insulating materials or organic insulating materials, where the inorganic insulating materials include silicon oxide, silicon nitride, or silicon oxynitride, etc., and the organic insulating materials include polymethyl methacrylate (PMMA), polyvinyl alcohol (PVA), polyvinyl phenol (PVP) or polyimide (PI), etc. A material of the filter layer CF may include a color filter material, such as a red filter material, a green filter material, and a blue filter material. Materials of the first shielding vertical line 250A and the pixel electrode 244 may include a transparent conductive material. In addition, the film layer of the first vertical signal line 232, the second vertical signal line 234 and the third vertical signal line 236 in FIG. 31 may be disposed between the insulating layer I1 and the insulating layer I2, and a stacking method of the second shielding vertical line 252A in the cross-sectional structure of FIG. 31 may be the same as that of the first shielding vertical line 250A.

In FIG. 33, the film layer of the first shielding vertical line 250A is located between the insulating layer I1 and the substrate 210. In some embodiments, the first shielding vertical line 250A and the not-shown transversal signal line may be formed by continuously stacked film layers, so that the first shielding vertical line 250A may be connected to the transversal signal line (not shown). Moreover, in other embodiments, the film layer of the first shielding vertical line 250A may be selectively located between the insulating layer I2 and the filter layer CF or between the filter layer CF and the insulating layer I3.

FIG. 34 is a partial schematic top view of an electronic device according to an embodiment of the disclosure. FIG. 34 illustrates the substrate 210, the first vertical signal line 232, the second vertical signal line 234, the third vertical signal line 236, the pixel electrode 244 of the pixel structure 240, a first shielding vertical line 250B, and a second shielding vertical line 252B of an electronic device 200B. To be specific, the electronic device 200B may be composed of the structures of FIG. 34 arranged in an array, and the electronic device 200B may also include lines and circuit structures such as transversal signal lines, active devices of the pixel structures 240, etc., but in order to clearly describe the configuration of the vertical lines, an omitted block BK is used in FIG. 34 to indicate a location of the above components. In some embodiments, the description of the embodiment of FIG. 2, etc., may be referred for the configuration of the transversal signal lines and the active devices.

The electronic device 200B is similar to the electronic device 200A, so that the same component symbols in the two embodiments denote the same components for cross reference. To be specific, a main difference between the electronic device 200B and the electronic device 200A lies in a layout of the first shielding vertical line 250B and the second shielding vertical line 252B. In the embodiment, the pixel electrode 244 may include the first sub-electrode 244A and the second sub-electrode 244B, and the first sub-electrode 244A and the second sub-electrode 244B are located on two opposite sides of the omitted block BK, and the first shielding vertical line 250B and the second shielding vertical line 252B are not overlapped with the second sub-electrode 244B. In other words, the first shielding vertical line 250B and the second shielding vertical line 252B are only overlapped with the first sub-electrode 244A. The first shielding vertical line 250B and the second shielding vertical line 252B are located on two opposite sides of the first sub-electrode 244A. The first shielding vertical line 250B is located between the first vertical signal line 232 and the second vertical signal line 234, and the second shielding vertical line 252B is located between the second vertical signal line 234 and the third vertical signal line 236. The descriptions of the first shielding vertical line 250A in FIG. 32 and FIG. 33 may be referred for a stacking order of the first shielding vertical line 250B and the second shielding vertical line 252B in the cross section.

FIG. 35 is a partial schematic top view of an electronic device according to an embodiment of the disclosure. FIG. 35 illustrates the substrate 210, the first vertical signal line 232, the second vertical signal line 234, the third vertical signal line 236, the pixel electrode 244 of the pixel structure 240, a first shielding vertical line 250C, and a second shielding vertical line 252C of an electronic device 200C. To be specific, the electronic device 200C is similar to the electronic device 200A, so that the same component symbols in the two embodiments denote the same components for cross reference.

A main difference between the electronic device 200C and the electronic device 200A lies in a layout of the first shielding vertical line 250C and the second shielding vertical line 252C. In the embodiment, the pixel electrode 244 may include the first sub-electrode 244A and the second sub-electrode 244B, and the first sub-electrode 244A and the second sub-electrode 244B are located on two opposite sides of the omitted block, and the first shielding vertical line 250C and the second shielding vertical line 252C are not overlapped with the first sub-electrode 244A. In other words, the first shielding vertical line 250C and the second shielding vertical line 252C are only overlapped with the second sub-electrode 244B. The first shielding vertical line 250C and the second shielding vertical line 252C are located on two opposite sides of the second sub-electrode 244B. The first shielding vertical line 250C is located between the first vertical signal line 232 and the second vertical signal line 234, and the second shielding vertical line 252C is located between the second vertical signal line 234 and the third vertical signal line 236. The descriptions of the first shielding vertical line 250A in FIG. 32 and FIG. 33 may be referred for a stacking order of the first shielding vertical line 250C and the second shielding vertical line 252C in the cross section.

FIG. 36 is a partial schematic top view of an electronic device according to an embodiment of the disclosure. FIG. 36 illustrates a substrate 310, a first vertical signal line 332, a second vertical signal line 334, a third vertical signal line 336, a pixel electrode 344 of a pixel structure 340, a first shielding vertical line 350A, and a second shielding vertical line 352A of an electronic device 300A. To be specific, the electronic device 300A may be composed of the structures of FIG. 36 arranged in an array, and the electronic device 300A may also include lines and circuit structures such as transversal signal lines, active devices of the pixel structures 340, etc., but in order to clearly describe the configuration of the vertical lines, an omitted block BK is used in FIG. 36 to indicate a location of the above components. In some embodiments, the description of the embodiment of FIG. 2, etc., may be referred for the configuration of the transversal signal lines and the active devices.

FIG. 36 illustrates two pixel structures 340, and the first vertical signal line 332, the second vertical signal line 334, and the third vertical signal line 336 are located between the two pixel structures 340. The second vertical signal line 334 is located between the first vertical signal line 332 and the third vertical signal line 336. In the embodiment, an orthogonal projection of the first shielding vertical line 350A on the substrate 310 is located between an orthogonal projection of the first vertical signal line 332 on the substrate 310 and an orthogonal projection of the second vertical signal line 334 on the substrate 310, and an orthogonal projection of the second shielding vertical line 352A on the substrate 310 is located between the orthogonal projection of the second vertical signal line 334 on the substrate 310 and an orthogonal projection of the third vertical signal line 336 on the substrate 310. Therefore, the orthogonal projection of the first shielding vertical line 350A on the substrate 310 is outside an orthogonal projection of the pixel electrode 344 on the substrate 310, and the orthogonal projection of the second shielding vertical line 352A on the substrate 310 is outside the orthogonal projection of the pixel electrode 344 on the substrate 310.

In the embodiment, the first shielding vertical line 350A and the second shielding vertical line 352A are, for example, transparent wires. In other words, the first shielding vertical line 350A and the second shielding vertical line 352A are made of transparent conductive materials. In addition, the pixel electrode 344 is also made of a transparent material. In some embodiments, the pixel electrode 344, the first shielding vertical line 350A, and the second shielding vertical line 352A may be of the same film layer, but in other embodiments, the film layer of the pixel electrode 344 may be different from the film layer of the first shielding vertical line 350A and the second shielding vertical line 352A.

FIG. 37 is a schematic cross-sectional view illustrating a structure of the first shielding vertical line 350A in the electronic device 300 according to an embodiment of the disclosure. According to FIG. 37, it is learned that the insulating layer I1, the insulating layer I2, the first shielding vertical line 350A, and the insulating layer I3 may be sequentially stacked on the substrate 310. The materials of the insulating layer I1, the insulating layer I2 and the insulating layer I3 may include inorganic insulating materials or organic insulating materials, where the inorganic insulating materials include silicon oxide, silicon nitride, or silicon oxynitride, etc., and the organic insulating materials include polymethyl methacrylate (PMMA), polyvinyl alcohol (PVA), polyvinyl phenol (PVP) or polyimide (PI), etc. The first shielding vertical line 350A disposed between the insulating layer I2 and the insulating layer I3 may be made of, for example, a transparent conductive material. In the embodiment, the film layer of the first vertical signal line 332, the second vertical signal line 334 and the third vertical signal line 336 may be located between the insulating layer I1 and the insulating layer I2, and the film layer of the not-shown transversal signal lines may be located between the substrate 310 and the insulating layer I1. Moreover, the film layer of the pixel electrode 344 may be located on the insulating layer I3. In other words, the insulating layer I3 may be disposed between the film layer of the pixel electrode 344 and the film layer of the first shielding vertical line 350A.

FIG. 38 is a schematic cross-sectional view illustrating a structure of the first shielding vertical line 350A in the electronic device 300 according to another embodiment of the disclosure. The cross-sectional structure of FIG. 38 is similar to the cross-sectional structure of FIG. 37, so that the same component symbols in the two embodiments denote the same components.

According to FIG. 38, it is learned that the insulating layer I1, the insulating layer I2, the first shielding vertical line 350A, the filter layer CF, and the insulating layer I3 may be sequentially stacked on the substrate 310. The related description of FIG. 37A may be referred for a stacking order and materials of the insulating layer I1, the insulating layer I2, the first shielding vertical line 350A, and the insulating layer I3. A material of the filter layer CF may include a color filter material, such as a red filter material, a green filter material, and a blue filter material.

FIG. 39 is a schematic cross-sectional view illustrating a structure of the electronic device 300 according to another embodiment of the disclosure. In FIG. 39, besides that the first vertical signal line 332, the pixel electrode 344 and the first shielding vertical line 350A in FIG. 36 are illustrated, the transversal signal line 320 configured in the omitted block BK is also illustrated to describe a stacking relationship of the components in the electronic device 300. According to FIG. 39, it is known that the transversal signal line 320, the insulating layer I1, the first vertical signal line 332, the insulating layer I2, and the pixel electrode 344 may be sequentially stacked on the substrate 310, and the pixel electrode 344 and the first vertical signal line 332 may be of the same film layer.

In summary, in the electronic device provided by the embodiments of the disclosure, the shielding lines (such as the first shielding vertical line, the second shielding vertical line, etc.) are arranged between different signal lines. The shielding lines may be connected to a common potential to provide a signal shielding function, thereby reducing interference between the signal lines. Therefore, the electronic device provided by the embodiments of the disclosure may exhibit favorable quality.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
a substrate;
a plurality of transversal signal lines, disposed on the substrate;
a first insulating layer and a first conducting structure penetrating the first insulating layer, disposed on the substrate;
a first vertical signal line, disposed on the substrate, intersected with the transversal signal lines;
a second vertical signal line, disposed on the substrate, intersected with the transversal signal lines, wherein the second vertical signal line is connected to one of the transversal signal lines through the first conducting structure;
a first shielding vertical line, disposed on the substrate, wherein an orthogonal projection of the first shielding vertical line on the substrate is located between an orthogonal projection of the first vertical signal line on the substrate and an orthogonal projection of the second vertical signal line on the substrate, wherein the transversal signal lines extend along a first direction, each of the first vertical signal line, the second vertical signal line and the first shielding vertical line extends along a second direction, and the first direction and the second direction are intersected with each other; and
a common electrode line disposed on the substrate, wherein the common electrode line is located between the adjacent two of the transversal signal lines and extends along the first direction, and the first shielding vertical line electrically connects the common electrode line, and wherein the common electrode line includes a first line and a second line, the first line and the second line are located between two directly adjacent transversal signal lines, and each of the first line and the second line extends along the first direction.

2. The electronic device according to claim 1, further comprising a plurality of pixel structures disposed on the substrate, wherein one of the pixel structures is surrounded by adjacent two of the transversal signal lines and the second vertical signal line and comprises a pixel electrode, wherein the pixel electrode is overlapped with the first vertical signal line or the second vertical signal line in a direction perpendicular to the substrate.

3. The electronic device according to claim 2, wherein the pixel electrode is overlapped with the first shielding vertical line.

4. The electronic device according to claim 2, wherein the pixel electrode traverses the second vertical signal line, the pixel electrode has a central trunk portion, and the second vertical signal line is overlapped with the central trunk portion.

5. The electronic device according to claim 1, wherein the first shielding vertical line is a transparent wire.

6. The electronic device according to claim 1, wherein the common electrode line is intersected with the first vertical signal line and the second vertical signal line.

7. The electronic device according to claim 1, wherein the first shielding vertical line and the common electrode line are directly stacked on each other.

8. The electronic device according to claim 1, wherein the first insulating layer is disposed between the first shielding vertical line and the common electrode line, and another first conducting structure electrically connects the first shielding vertical line and the common electrode line.

9. The electronic device according to claim 1, further comprising a plurality of pixel structures disposed on the substrate, wherein one of the pixel structures is located between adjacent two of the transversal signal lines and comprises a pixel electrode, wherein a film layer of the first shielding vertical line is located between a film layer of the common electrode line and a film layer of the pixel electrode.

10. The electronic device according to claim 1, further comprising a plurality of pixel structures disposed on the substrate, wherein one of the pixel structures is located between adjacent two of the transversal signal lines and comprises a pixel electrode, wherein a film layer of the common electrode line is located between a film layer of the first shielding vertical line and a film layer of the pixel electrode.

11. The electronic device according to claim 1, wherein the first shielding vertical line is overlapped with the first line, the second line, or both the first line and the second line.

12. The electronic device according to claim 1, further comprising a second shielding vertical line, wherein the first vertical signal line is located between the first shielding vertical line and the second shielding vertical line.

13. The electronic device according to claim 12, further comprising a third vertical signal line, wherein the third vertical signal line is located between the first vertical signal line and the second shielding vertical line.

14. The electronic device according to claim 13, further comprising a fourth vertical signal line, wherein orthogonal projections of the first vertical signal line and the third vertical signal line on the substrate are located between the orthogonal projection of the second vertical signal line on the substrate and an orthogonal projection of the fourth vertical signal line on the substrate.

15. The electronic device according to claim 1, further comprising: a shielding electrode, connected to the first shielding vertical line.

16. The electronic device according to claim 1, wherein the first shielding vertical line is completely located between adjacent two of the transversal signal lines.

17. The electronic device according to claim 1, further comprising:
a plurality of pixel structures disposed on the substrate, wherein one of the pixel structures comprises a pixel electrode, wherein the orthogonal projection of the first shielding vertical line on the substrate is outside an orthogonal projection of the pixel electrode on the substrate.

18. The electronic device according to claim 1, further comprising a plurality of pixel structures and a third vertical signal line, wherein the pixel structures are arranged on the substrate in an array, the second vertical signal line is located between the third vertical signal line and the first vertical signal line, and the first vertical signal line, the second vertical signal line, and the third vertical signal line are located between two adjacent rows of the pixel structures.

19. The electronic device according to claim 18, further comprising a second shielding vertical line disposed on the substrate, wherein an orthogonal projection of the second shielding vertical line on the substrate is located between the orthogonal projection of the second vertical signal line on the substrate and an orthogonal projection of the third vertical signal line on the substrate.

20. The electronic device according to claim 1, further comprising a plurality of pixel structures disposed on the substrate, wherein one of the pixel structures is located between adjacent two of the transversal signal lines and comprises a pixel electrode, wherein a film layer of the first shielding vertical line is located below a film layer of the pixel electrode.

* * * * *